(12) United States Patent
Kemp

(10) Patent No.: US 11,950,520 B2
(45) Date of Patent: Apr. 2, 2024

(54) OPTICALLY SWITCHABLE MEMORY

(71) Applicant: THE UNIVERSITY OF HULL, Hull Humberside (GB)

(72) Inventor: Neil Kemp, Hull Humberside (GB)

(73) Assignee: THE UNIVERSITY OF HULL, Hull Humberside (GB)

( * ) Notice: Subject to any disclaimer, the term of this patent is extended or adjusted under 35 U.S.C. 154(b) by 312 days.

(21) Appl. No.: 17/270,279

(22) PCT Filed: Aug. 19, 2019

(86) PCT No.: PCT/GB2019/052318
§ 371 (c)(1),
(2) Date: Feb. 22, 2021

(87) PCT Pub. No.: WO2020/039171
PCT Pub. Date: Feb. 27, 2020

(65) Prior Publication Data
US 2021/0242397 A1    Aug. 5, 2021

(30) Foreign Application Priority Data
Aug. 23, 2018 (GB) .................................... 1813748

(51) Int. Cl.
*H10N 70/20* (2023.01)
*G06N 3/08* (2023.01)
(Continued)

(52) U.S. Cl.
CPC ............. *H10N 70/257* (2023.02); *G06N 3/08* (2013.01); *H10B 63/80* (2023.02);
(Continued)

(58) Field of Classification Search
CPC ............................... H10N 70/00; H10N 63/00
See application file for complete search history.

(56) References Cited

U.S. PATENT DOCUMENTS

| 3,801,966 A | 4/1974 | Terao |
| 9,747,976 B2 | 8/2017 | Jackson et al. |

(Continued)

FOREIGN PATENT DOCUMENTS

| CN | 105355782 | 2/2016 |
| CN | 106981567 | 7/2017 |

(Continued)

OTHER PUBLICATIONS

Bozano et al. "Mechanism for bistability in organic memory elements," Applied Physics Letters, Jan. 2004, vol. 84, No. 4, pp. 607-609.

(Continued)

*Primary Examiner* — Marvin Payen
(74) *Attorney, Agent, or Firm* — Sheridan Ross P.C.

(57) ABSTRACT

A method of manufacturing a storage device for storing information, apparatus for storing information, an optical memristor device and a memory cell are disclosed. A method comprises providing at least one first electrode and at least one further electrode and providing each of at least one region of a first material between, and in electrical connection with, a respective first electrode and a further electrode whereby said step of providing at least one region comprises providing in the first material, a plurality of changeable particles that have charge storage capacity and at least one electrical property that is reversibly changeable responsive to absorption of incident electromagnetic radiation.

20 Claims, 22 Drawing Sheets

(51) Int. Cl.
H10B 63/00 (2023.01)
H10N 70/00 (2023.01)
(52) U.S. Cl.
CPC ......... H10N 70/011 (2023.02); H10N 70/231 (2023.02); H10N 70/828 (2023.02)

(56) References Cited

U.S. PATENT DOCUMENTS

| | | |
|---|---|---|
| 2006/0231889 A1 | 10/2006 | Chen et al. |
| 2007/0133272 A1 | 6/2007 | Yu et al. |
| 2008/0001137 A1 | 1/2008 | Kozicki et al. |
| 2008/0042167 A1 | 2/2008 | Chen et al. |
| 2010/0272386 A1 | 10/2010 | Fu et al. |
| 2011/0266512 A1 | 11/2011 | Chen et al. |
| 2018/0166495 A1* | 6/2018 | Ang .................. H10N 70/826 |

FOREIGN PATENT DOCUMENTS

| | | |
|---|---|---|
| CN | 107819069 | 3/2018 |
| EP | 2230794 | 9/2010 |
| GB | 2500694 | 10/2013 |
| GB | 2532086 | 5/2016 |
| WO | WO 2010/077371 | 7/2010 |
| WO | WO 2016/040792 | 3/2016 |

OTHER PUBLICATIONS

Bruns et al. "Nanosecond switching in GeTe phase change memory cells," Applied Physics Letters, 2009, vol. 95, article 043108, 4 pages.
Chen et al. "Size-dependent and tunable crystallization of GeSbTe phase-change nanoparticles," Scientific Reports, vol. 6, article 39546, 10 pages.
Coombs et al. "Laser-induced crystallization phenomena in GeTe-based alloys. II. Composition dependence of nucleation and growth," Journal of Applied Physics, 1995, vol. 78, pp. 4918-4928.
Crick "A general method for the incorporation of nanoparticles into superhydrophobic films by aerosol assisted chemical vapour deposition," Journal of Materials Chemistry A, 2013, vol. 1, pp. 4336-4344.
ESSAM "Percolation theory," Reports on Progress in Physics, 1980, vol. 43, No. 7, pp. 833-912.
Friedrich et al. "Structural transformations of Ge2Sb2Te5 films studied by electrical resistance measurements," Journal of Applied Physics, May 2000, vol. 87, No. 9, pp. 4130-4134.
Ghosh et al. "Core-Shell Nanoparticles: An Approach to Enhance Electrical Bistability," Journal of Physical Chemistry C, 2008, vol. 112, pp. 11290-11294.
Gupta et al. "Entropy-driven segregation of nanoparticles to cracks in multilayered composite polymer structures," Nature Materials, Mar. 2006, vol. 5, pp. 229-233.
Haryono et al. "Controlled Arrangement of Nanoparticle Arrays in Block-Copolymer Domains," Small, 2006, vol. 2, No. 5, pp. 600-611.
Hill et al. "A fast low-power optical memory based on coupled micro-ring lasers," Nature, Nov. 2004, vol. 432, pp. 206-209.
Hong et al. "Electrical behavior of low density polyethylene containing an inhomogeneous distribution of ZnO nanoparticles," Journal of Materials Science, 2006, vol. 41, pp. 5810-5814.
Kemker et al. "Measuring Catastrophic Forgetting in Neural Networks," arXiv, Nov. 9, 2017, 1708.02072v4, 15 pages.
Kim et al. "Stretchable nanoparticle conductors with self-organized conductive pathways," Nature, Aug. 2013, vol. 500, pp. 59-63.
Kuramochi et al. "Large-scale integration of wavelength-addressable all-optical memories on a photonic crystal chip," Nature Photonics, 2014, vol. 8, pp. 474-481.
Linn et al. "Complementary resistive switches for passive nanocrossbar memories," Nature Materials, 2010, vol. 9, pp. 403-406.
Liu et al. "An ultra-small, low-power, all-optical flip-flop memory on a silicon chip," Nature Photonics, 2010, vol. 4, pp. 182-187.
Loke et al. "Breaking the Speed Limits of Phase-Change Memory," Science, Jun. 2012, vol. 336, pp. 1566-1569.
Ma et al. "Nonvolatile electrical bistability of organic/metal-nanocluster/organic system," Applied Physics Letters, Mar. 2003, vol. 82, No. 9, pp. 1419-1421.
Palgrave et al. "Aerosol Assisted Chemical Vapor Deposition Using Nanoparticle Precursors: A Route to Nanocomposite Thin Films," Journal of the American Chemical Society, 2006, vol. 128, pp. 1587-1597.
Pan et al. "Nonvolatile resistive switching memories-characteristics, mechanisms and challenges," Progress in Natural Science: Materials International, 2010, vol. 20, 15 pages.
Rios et al. "Integrated all-photonic non-volatile multi-level memory," Nature Photonics, 2015, vol. 9, pp. 725-732.
Sapogova et al. "Diffusion-controlled alteration of inhomogeneous materials: tailoring of the spatial distribution of nanoparticles in nanocomposites," Physical Chemistry Chemical Physics, 2016, vol. 18, No. 48, pp. 32921-32930.
Shacham et al. "Photonic Network-on-Chip for Future Generations of Chip Multi-Processors," IEEE Transactions on Computers, Sep. 2008, vol. 57, No. 9, pp. 1246-1260.
Shaw et al. "Photoredox Catalysis in Organic Chemistry," The Journal of Organic Chemistry, 2016, vol. 81, pp. 6898-6926.
Simmons et al. "New conduction and reversible memory phenomena in thin insulating films," Proceedings of the Royal Society of London, Series A, Mathematical and Physical Sciences, Oct. 1967, vol. 301, No. 1464, pp. 77-102.
Stauffer "Scaling Theory of Percolation Clusters," Physics Reports, 1979, vol. 54, No. 1, pp. 1-74.
Sun et al. "Crystallization of Ge2Sb2Te5 thin films by nano- and femtosecond single laser pulse irradiation," Scientific Reports, 2016, vol. 6, article 28246, 8 pages.
Tan et al. "An Optoelectronic Resistive Switching Memory with Integrated Demodulating and Arithmetic Functions," Advanced Materials, 2015, vol. 27, pp. 2797-2803.
Terauchi et al. "Fabrication Of Au Nanoparticles By Radio-Frequency Magnetron Sputtering," NanoStructural Materials, 1995, vol. 5, No. 1, pp. 71-78.
Tseng et al. "Charge transfer effect in the polyaniline-gold nanoparticle memory system," Applied Physics Letters, 2007, vol. 90, article 053101, 3 pages.
Vervaele et al. "Development of a new direct liquid injection system for nanoparticle deposition by chemical vapor deposition using nanoparticle solutions," Review of Scientific Instruments, 2016, vol. 87, article 025101, 8 pages.
Wang et al. "MoS2 memristor with photoresistive switching," Scientific Reports, 2016, vol. 6, article 31224, 11 pages.
Wei et al. "Electrical conductivity of thin-film composites containing silver nanoparticles embedded in a dielectric fluoropolymer matrix," Thin Solid Films, 2008, vol. 517, pp. 575-581.
Yamada et al. "Structure of laser-crystallized Ge2Sb2+xTe5 sputtered thin films for use in optical memory," Journal of Applied Physics, Dec. 2000, vol. 88, No. 12, pp. 7020-7028.
Yoon et al. "Generation of phase-change Ge—Sb—Te nanoparticles by pulsed laser ablation," Journal of Non-Crystalline Solids, 2005, vol. 351, pp. 3430-3434.
International Preliminary Report on Patentability for International (PCT) Patent Application No. PCT/GB2019/052318, dated Feb. 23, 2021, 6 pages.
Jaafar et al. "Reversible optical switching memristors with tunable STDP synaptic plasticity: a route to hierarchical control in artificial intelligent systems," Nanoscale, Nov. 2017, vol. 9, No. 43, pp. 17091-17098 (abstract only).
Shih et al. "Resistive Switching Modification by Ultraviolet Illumination in Transparent Electrode Resistive Random Access Memory," IEEE Electron Device Letters, Jun. 2014, vol. 35, No. 6, pp. 633-635.
Wu et al. "Capping CsPbBr3 with ZnO to improve performance and stability of perovskite memristors," Nano Research, Oct. 2016, vol. 10, No. 5, pp. 1584-1594.

(56) References Cited

OTHER PUBLICATIONS

Official Action for United Kingdom Patent Application No. GB1813748.9, dated Jan. 29, 2019, 4 pages.
Official Action for United Kingdom Patent Application No. GB 1813748.9, dated Nov. 26, 2018, 5 pages.
International Search Report and Written Opinion for International (PCT) Patent Application No. PCT/GB2019/052318, dated Dec. 10, 2019, 13 pages.

* cited by examiner

After optical illumination

Before optical illumination

Homogeneous Percolating Network

Inhomogeneous Percolating Network

OPTICALLY SWITCHABLE MEMORY

CROSS REFERENCE TO RELATED APPLICATIONS

This application is a national stage application under 35 U.S.C. 371 and claims the benefit of PCT Application No. PCT/GB2019/052318 having an international filing date of 19 Aug. 2019, which designated the United States, and which PCT application claimed the benefit of Great Britain Patent Application No. GB1813748.9 filed 23 Aug. 2018, the contents of each of which are incorporated herein by reference in their entireties.

The present invention relates to a method and apparatus for storing information. In particular but not exclusively, the present invention relates to a storage device and method of manufacturing a storage device which includes a region of a material that includes embedded particles, molecules, quantum dots or complexes that have at least one electrical property that is reversibly changeable responsive to absorption of incident electromagnetic radiation. The particles, dots, molecules or complexes also have charge storage capability. Incident radiation such as optical light can selectively illuminate the embedded elements to reversibly and quickly set an electrical property at a value indicative of an information state.

Various memory methodologies and devices are known whereby information can be stored for future use. For example, volatile or non-volatile memory technologies are known. An example of non-volatile memory is based upon resistive memory (RRAM or memristor) technology. Such resistive memory stores information by having different electrical resistance values (or resistance states) which are indicative of respective information. Such resistance values can be a two-level system indicating having high and low resistive states synonymous with a stored 0 or 1 value. Alternatively, many discreet states can be defined. Such conventional many discreet state resistive memory is called multi-level memory. Traditionally resistive memory switches by electrical means. That is to say usually the memory state is switched via the selective application of voltage pulses.

Certain alternatives to conventional techniques have been mooted. For example, Jaafar et al "Reversible optical switch memristors with tunable STDP synaptic plasticity: a route to hierarchical control in artificial intelligent systems. Nanoscale 9, 17091 (2017) describes an optical memristor with reversible optical switching functionality. This paper also demonstrates how neuro-morphic computing applications for the developed devices can be used as artificial synapses with learning properties that are dynamically tunable by light. However, a governing mechanism for the optical switch defined in Jaafar involves a photo-mechanical mechanism based upon the expansion and contraction of a polymeric material. As a result the optical switching times of a device are slow with approximately 15 minutes of time being required to switch states. Such slow switching times make the practical use of such memristors impossible.

It is an aim of the present invention to at least partly mitigate the above-mentioned problems.

It is an aim of certain embodiments of the present invention to provide an ultra-fast optical switching resistive memory device that is switchable by optical and optionally additionally electronic techniques.

It is an aim of certain embodiments of the present invention to provide a memory cell or a memory array including multiple such memory cells whereby electrical properties in an active region of the memory cells can be switched and thereby set responsive to incident electromagnetic radiation in less than 60 seconds.

It is an aim of certain embodiments of the present invention to provide an optical memristor device for reversible latched switching which is switchable responsive to incident electromagnetic radiation in less than 60 seconds and optionally less than 300 ns.

It is an aim of certain embodiments of the present invention to provide an optical memristor device which can be fabricated using techniques compatible with industry standard semiconductor and integrated chip manufacturing methods which are sometimes referred to as CMOS compatible techniques.

It is an aim of certain embodiments of the present invention to provide a memory device in a vertical stack configuration or planar side-by-side configuration in which electromagnetic radiation in the form of optical light illumination can be used from above, underneath or from the side to set or reset a state of the device which thus effectively sets or resets a stored information state of the device.

It is an aim of certain embodiments of the present invention to provide a memory device in which the magnitude and sensitivity of the electronic and optical switching properties can be set so that very large changes in an electrical property, such as conductance, can be generated by very short (in time) and/or relatively low intensity incident electromagnetic radiation.

It is an aim of certain embodiments of the present invention to provide an active region for a memory cell or other such storage device that has an ability to store charge and have an electrical property that can be optically switched between at least two, and optionally many, states indicative of corresponding information content.

It is an aim of certain embodiments of the present invention to provide an artificial neural network that can be reconfigured and/or erased and/or trained using optical techniques.

According to a first aspect of the present invention there is provided a method of manufacturing a storage device for storing information, comprising the steps of:
  providing at least one first electrode and at least one further electrode; and
  providing each of at least one region of a first material between, and in electrical connection with, a respective first electrode and a further electrode; whereby
  said step of providing at least one region comprises providing in the first material, a plurality of changeable particles that have charge storage capacity and at least one electrical property that is reversibly changeable responsive to absorption of incident electromagnetic radiation.

Aptly the electromagnetic radiation is in the wavelength range of 10-830 nm. Aptly the electromagnetic radiation is visible and/or UV and/or Extreme UV (EUV).

Aptly the electromagnetic radiation comprises optical light in the wavelength range 300-830 nm.

Aptly the electrical property is switchable responsive to incident electromagnetic radiation in less than 60 seconds between a first electrical property state and at least one further electrical property state and optionally less than 300 ns.

Aptly the electrical property is also reversibly changeable responsive to selective application of an electrical signal applied via the first and further electrode.

Aptly said step of providing at least one region comprises embedding a plurality of charge storage particles that have charge storage capability in an insulating material that comprises said first material and embedding the plurality of changeable particles in the insulating material.

Aptly said step of providing at least one region comprises embedding the plurality of changeable particles, in an insulating material, as a plurality of particles that have both charge storage capability and at least one electrical property that is reversibly changeable responsive to absorption of incident electromagnetic radiation.

Aptly the method further comprises providing said first electrode on a substrate;
providing said region over said first electrode; and
providing said further electrode over said region.

Aptly the method further comprises providing each said first and/or further electrode by providing a strip of partially or fully transparent electrode material.

Aptly said electrode material comprises Indium tin oxide (ITO).

Aptly the method further comprises providing said first electrode on a substrate;
providing region on said substrate adjacent to said first electrode; and
providing said further electrode adjacent to said region in a spaced apart relationship with said first electrode.

Aptly the method further comprises providing a charge blocking barrier between said region and said first electrode and/or between said region and said further electrode.

Aptly the method further comprises providing said substrate as a layer of optically transparent or at least partially optically transparent material.

Aptly said step of providing a region of a first material comprises depositing a thin film of an inorganic insulating material and said step of embedding a plurality of charge storage particles comprises embedding metallic particles and desired particles of a phase change material in the inorganic insulating material.

Aptly the method further comprises depositing the thin film as a homogeneous percolating network on a substrate.

Aptly the method further comprises selecting a volume fraction of metallic particles and desired particles relative to an amount of the insulating material.

Aptly said step of providing each region comprises a step of automated sequential deposition of a thin film of an inorganic insulating material and metallic particles and desired particles of a phase change material.

Aptly the method further comprises depositing the thin film as an inhomogeneous percolating network on a substrate.

Aptly the method further comprises selectively providing a patterned mask and repeatedly depositing inorganic insulating material and depositing particles through the mask to thereby embed particles in the insulating material or alternatively simultaneously depositing insulating material and nanoparticles via an angled deposition technique.

Aptly said step of providing each region comprises co depositing particles in said first material via a direct liquid injection method.

According to a second aspect of the present invention there is provided apparatus for storing information, comprising;
at least one first electrode and at least one further electrode;
at least one region of a first material each region being disposed between, and in electrical connection with, a respective first electrode and a further electrode; and
a plurality of changeable particles, in the first material, that have charge storage capability and at least one electrical property that is reversibly changeable responsive to absorption of incident electromagnetic radiation.

Aptly the electromagnetic radiation is in the wavelength range of 10-830 nm. Aptly the electromagnetic radiation is visible and/or UV and/or Extreme UV (EUV).

Aptly the electromagnetic radiation comprises optical light in the wavelength range 300-830 nm.

Aptly the electrical property is switchable responsive to incident electromagnetic radiation in less than 60 seconds between a first electrical property state and at least one further electrical property state and optionally less than 300 ns.

Aptly the apparatus further comprises a plurality of charge storage particles that have charge storage capability embedded in an insulating material that comprises said first material; and
the plurality of changeable particles are embedded in the insulating material.

Aptly the changeable particles are embedded in an insulating material and are particles that have both charge storage capability and at least one electrical property that is reversibly changeable responsive to absorption of incident light.

Aptly the insulating material is non-photoactive.

Aptly said charge storage particles provide impurity states within a forbidden band gap of the insulating material.

Aptly the changeable particles are particles of a material that exhibits at least one order of magnitude change in electrical conductivity when illuminated with optical light.

Aptly the changeable particles are particles of phase change material.

Aptly the changeable particles are particles of a material that exhibit photo doping or comprise photo redox molecules.

Aptly said insulating material is inorganic or organic based.

Aptly said insulating material is optically transparent.

Aptly said insulating material is a layer of transparent insulator material and optionally is $SiO_2$ or PMMA.

Aptly each embedded particle has a diameter of less than 50 μm.

Aptly the apparatus further comprises an input optical light guide element disposed on a first side of said region and an output optical light guide element disposed on a remaining side of said region.

According to a third aspect of the present invention there is provided an optical memristor device for reversible latched switching wherein at least a portion of the device has an electrical property that is indicative of a memristor state and is switchable responsive to incident electromagnetic radiation in less than 60 seconds between a first property state and at least one further property state and optionally is switchable in less than 300 ns.

Aptly the electrical property is switchable between states in less than 10 ns and optionally less than 1 ns.

Aptly the memristor device is switchable in response to electromagnetic radiation in the wavelength range 10-830 nm. Aptly the electromagnetic radiation is visible and/or UV and/or EUV.

Aptly the memristor device is switchable in response to optical light in a wavelength range of between 300-830 nm.

According to a fourth aspect of the present invention there is provided a memory cell, comprising:
- a bit line;
- a word line;
- a bit line electrode;
- a word line electrode; and
- an active region between and in electrical connection with the bit line electrode and the word line electrode, wherein an electrical property in the active region that is indicative of a memory cell state is switchable responsive to incident electromagnetic radiation in less than 60 seconds between a first electrical property state and at least one further electrical property state.

Aptly the electrical property is switchable between only the first electrical property state and a single further electrical property state.

Aptly the electrical property is switchable between the first electrical property state and a plurality of further possible electrical property states and between a selected one of the further possible electrical property states and at least one of a remainder of the further possible electrical property states.

Aptly the electrical property is switchable between the first electrical property state and the at least one further electrical property state is less than 300 ns and optionally less than 50 ns.

Aptly the active region provides a channel region and the bit line electrode and word line electrode are disposed on opposite sides of the channel region for generating an electric potential across the channel region.

Aptly the memory cell further comprises a charge blocking barrier between the active region and said bit line electrode and/or between the active region and the word line electrode.

Certain embodiments of the present invention provide an ultra-fast optically switchable electronic resistive random access memory.

Certain embodiments of the present invention provide a memory device which enables an electrical property, such as resistance, to be reversibly changed from/to a desired state in less than 60 seconds and optionally less than 300 ns. In certain embodiments switching states can occur in less than 10 ns.

Certain embodiments of the present invention provide a memory device which can be provided in either a vertical stack-like configuration or a planar device configuration.

Certain embodiments of the present invention provide a memory device which has a memory state that can be switched via incident electromagnetic radiation absorption. Optionally electromagnetic radiation in the range 10-830 nm can be utilised. Optionally optical light in the wavelength range of 300-830 nm, characteristic of many commercially available laser sources, (e.g. surface mount laser diode) or LEDs can be utilised.

Certain embodiments of the present invention provide a memory device and method of manufacturing a memory device in which a two-state memory is provided. The electrical properties, such as resistance or conductivity or the like, of the memory device is either in a low or high mode indicative of a digital nought or one.

Certain embodiments of the present invention provide a memory device which can be set into one of many possible states. That is to say an electrical property, which is reversibly changeable responsive to absorption of incident electromagnetic radiation, can be fixed at a broad number of possible values. This is analogous to being able to store an "analogue" information content. This is particularly useful for neural network applications.

Certain embodiments of the present invention provide a neural network where a connection strength between an input and output is dependent on connection strengths of multiple interconnecting pathways contained within an intermediate hidden layer. Memory devices according to certain embodiments of the present invention can be used in the hidden layer and trained by having electrical properties of respective storage devices reversibly changed and thereby set. An advantage of a neural network containing optical memristors of this type is that the network can be reconfigured, erased or trained using optical mechanisms.

Certain embodiments of the present invention provide a convenient method of manufacturing a memory cell or a memory array including multiple memory cells or a neural network.

Certain embodiments of the present invention will now be described hereinafter, by way of example only, with reference to the accompanying drawings in which.

Figure 5:
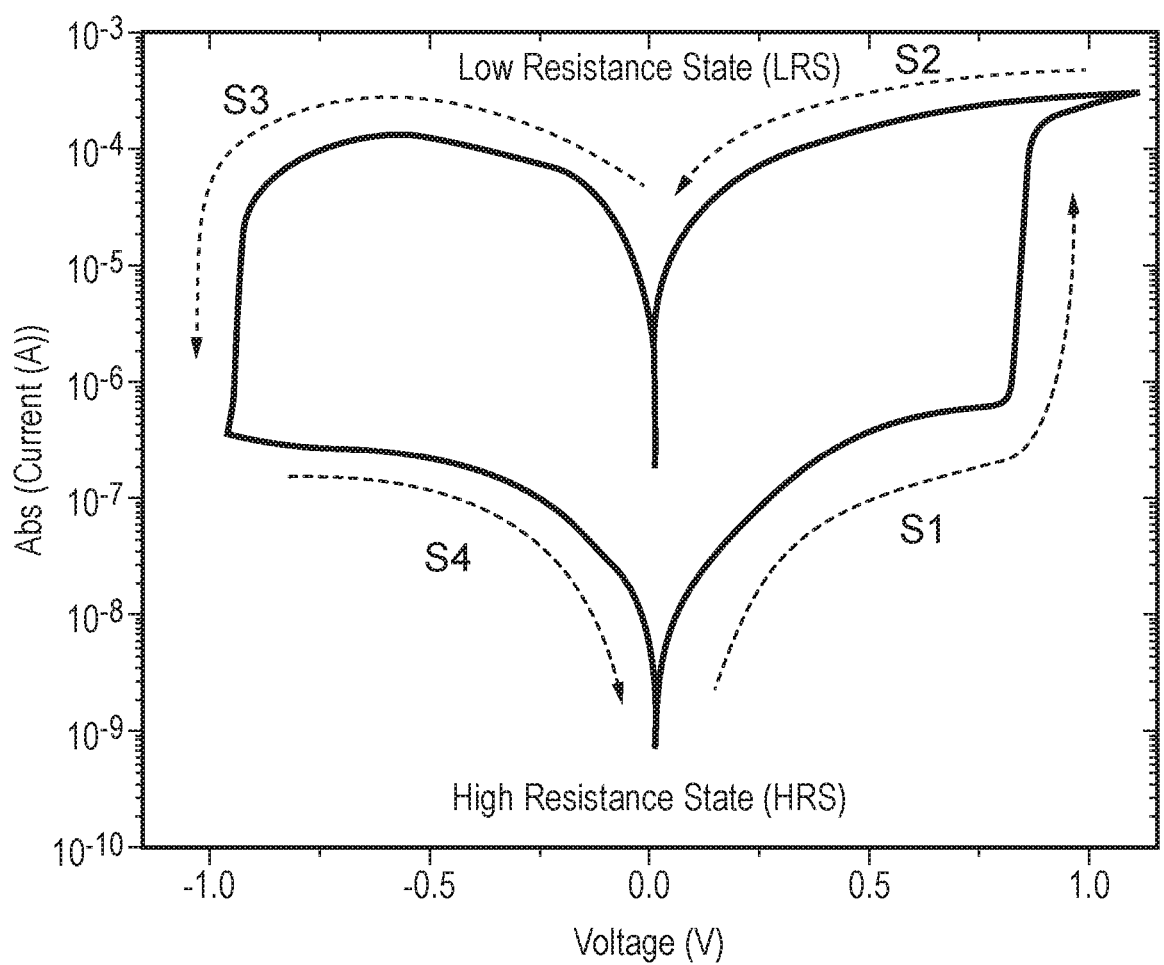
Figure 6:
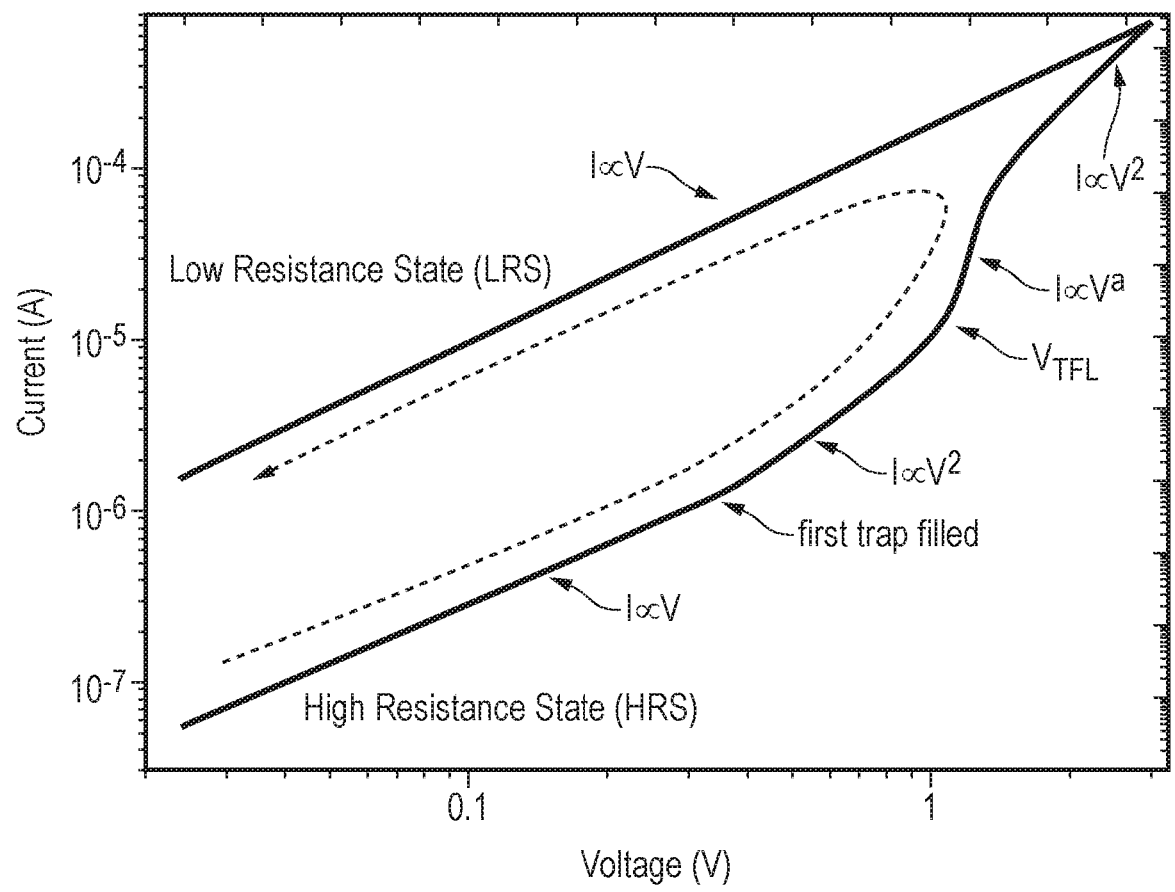
Figure 7:
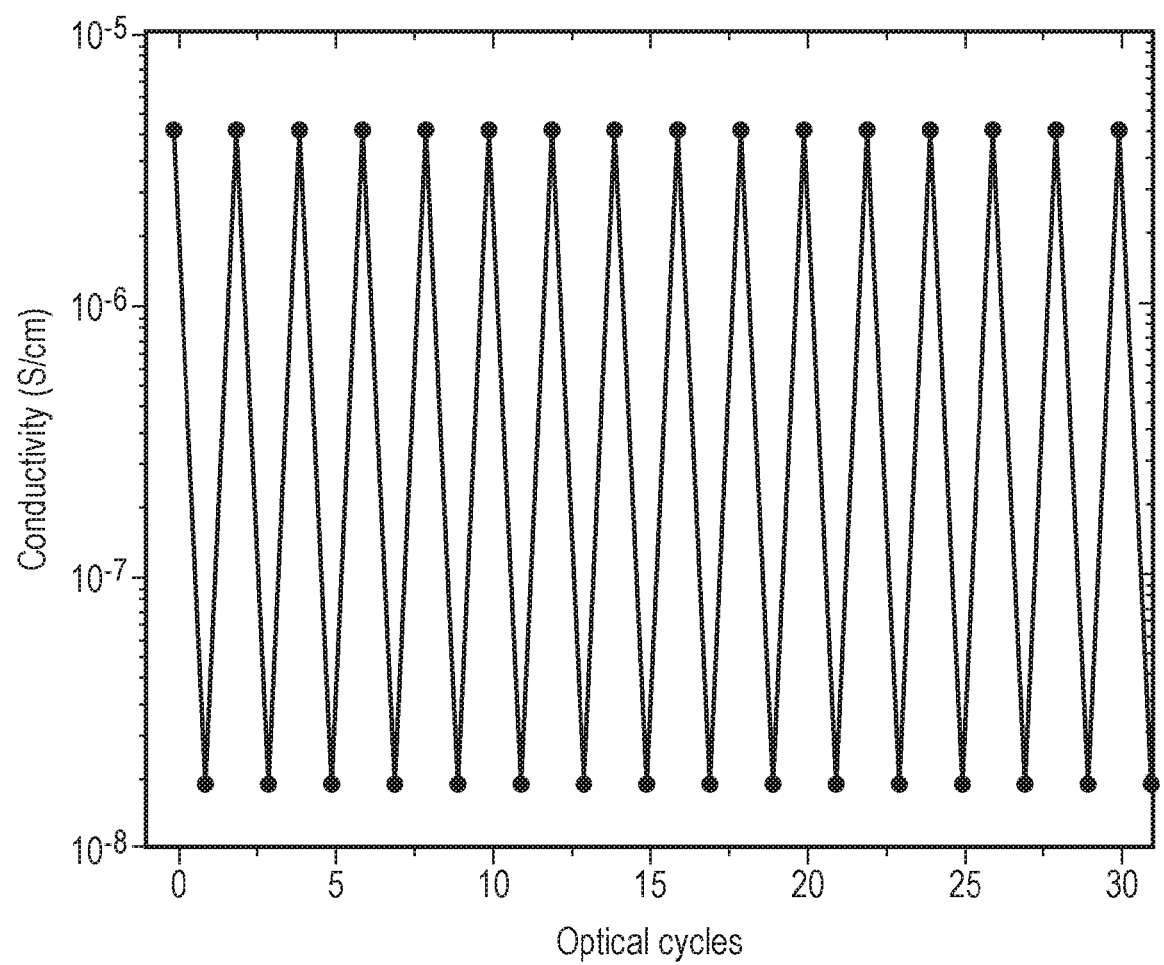
Figure 8:
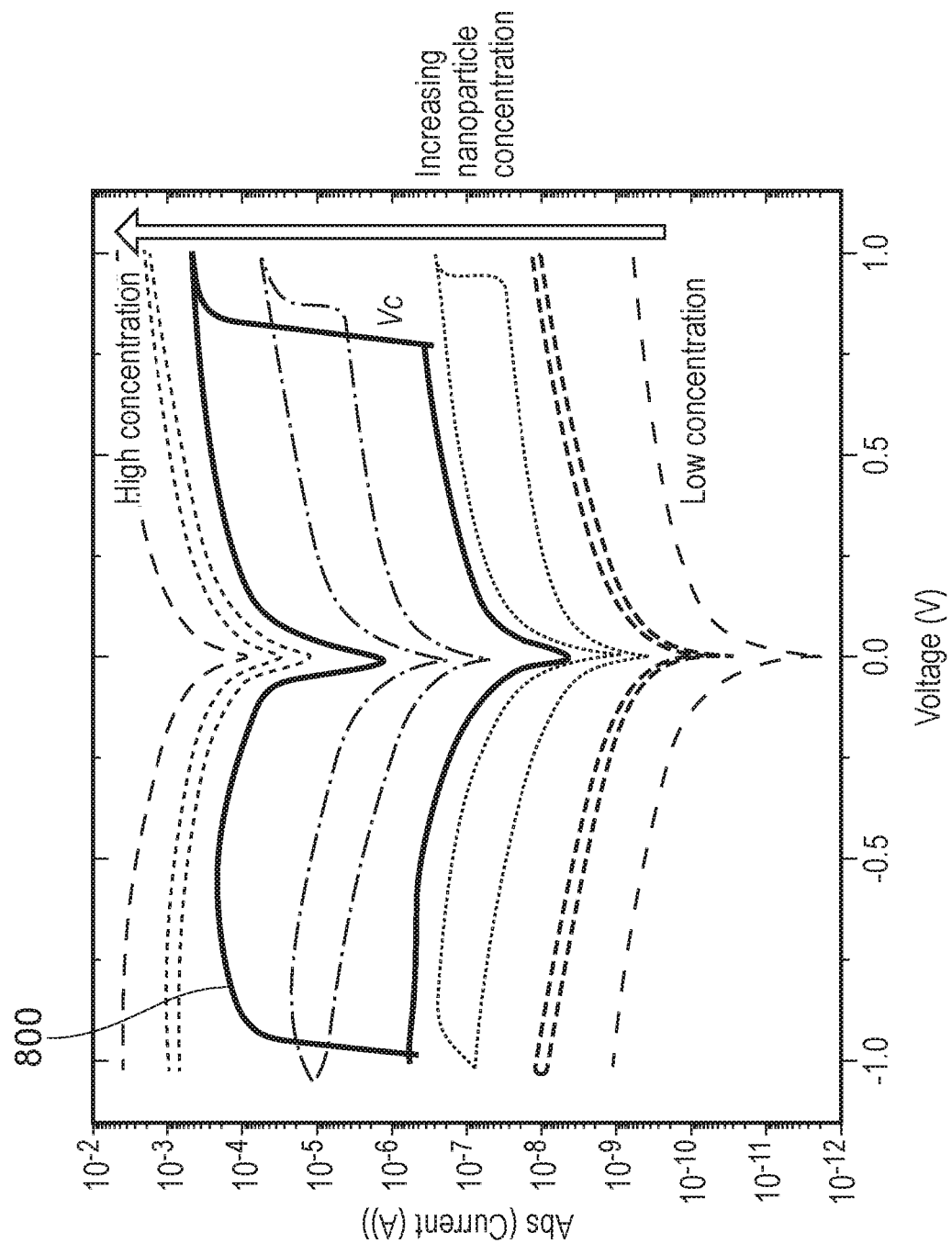
Figure 9:
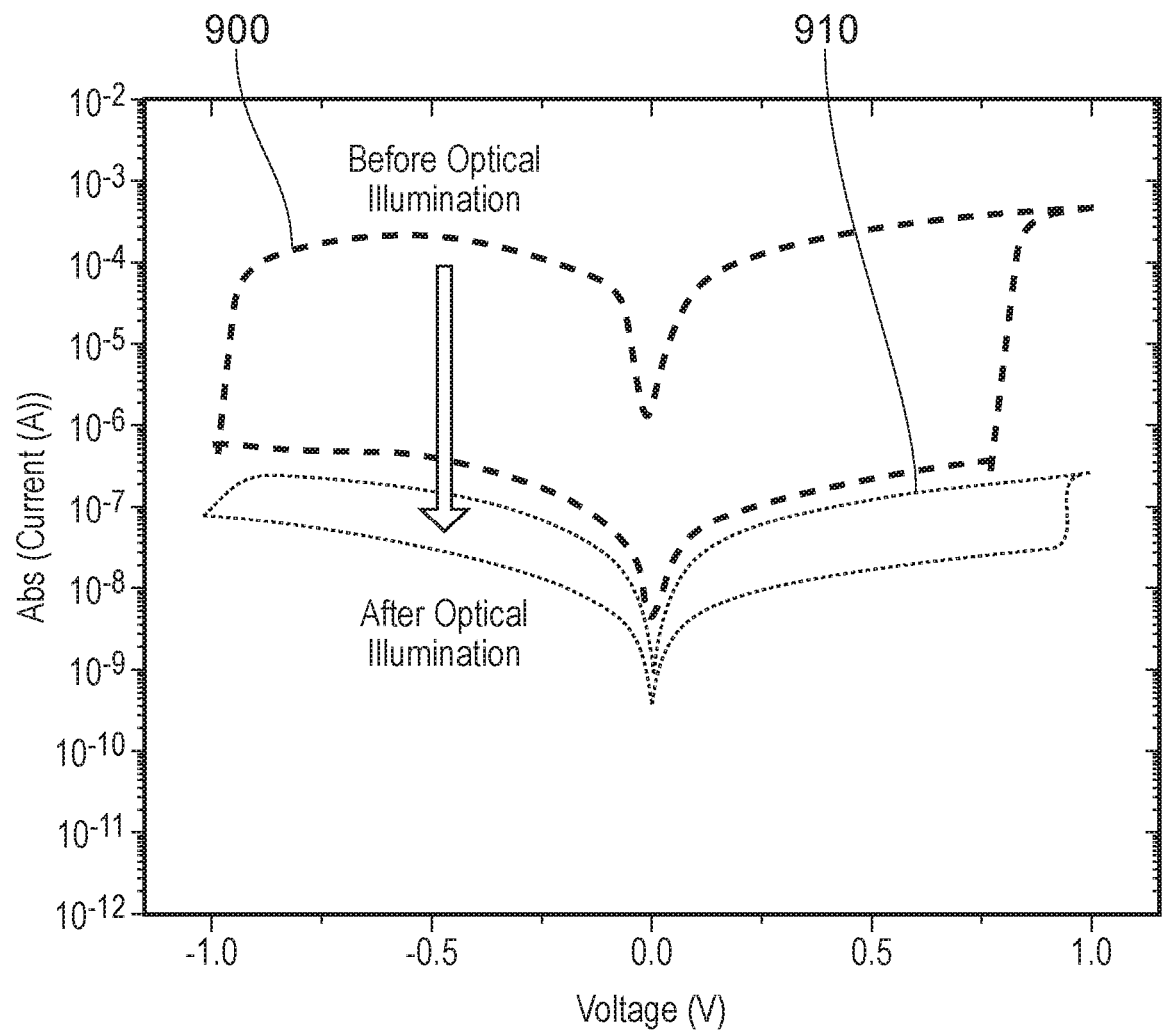
Figure 11:
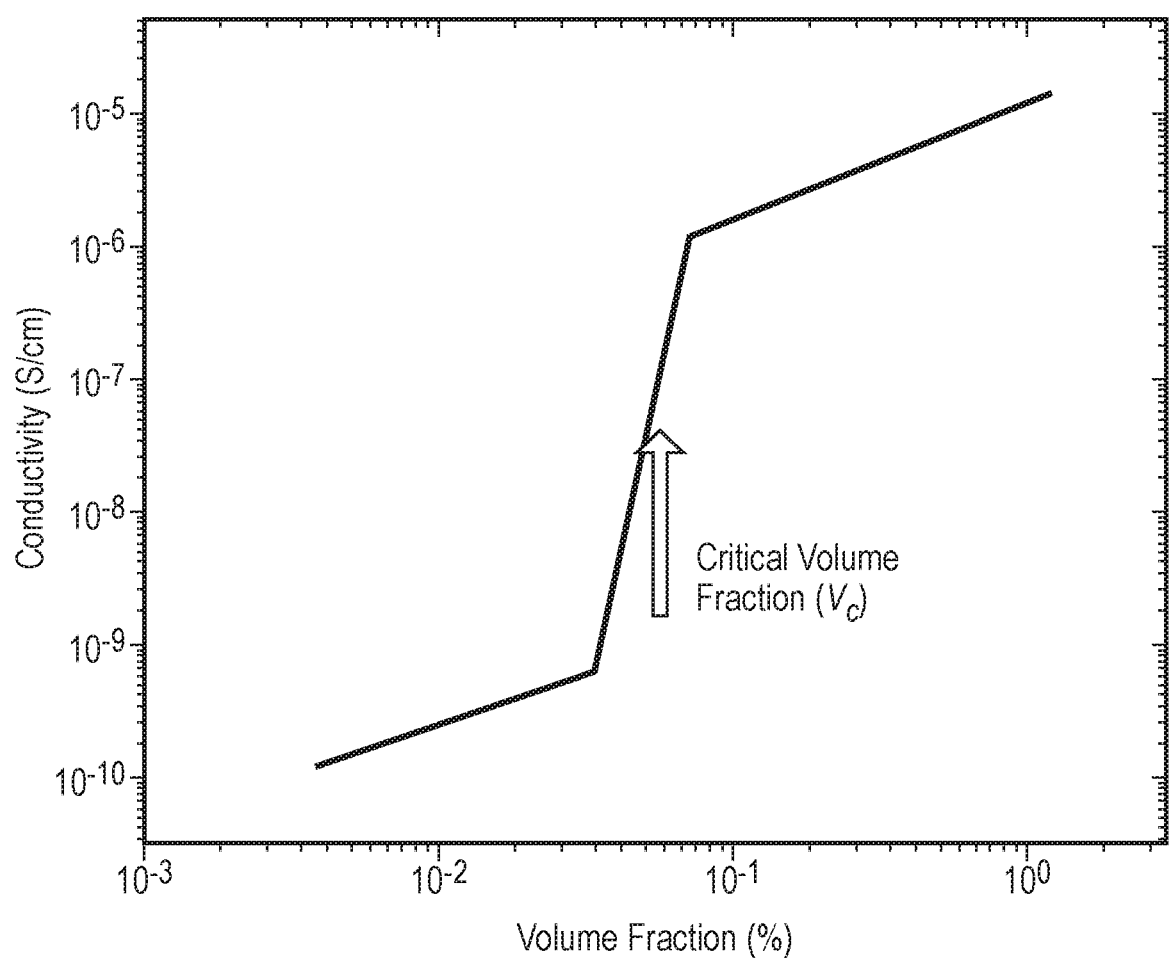
Figure 12:
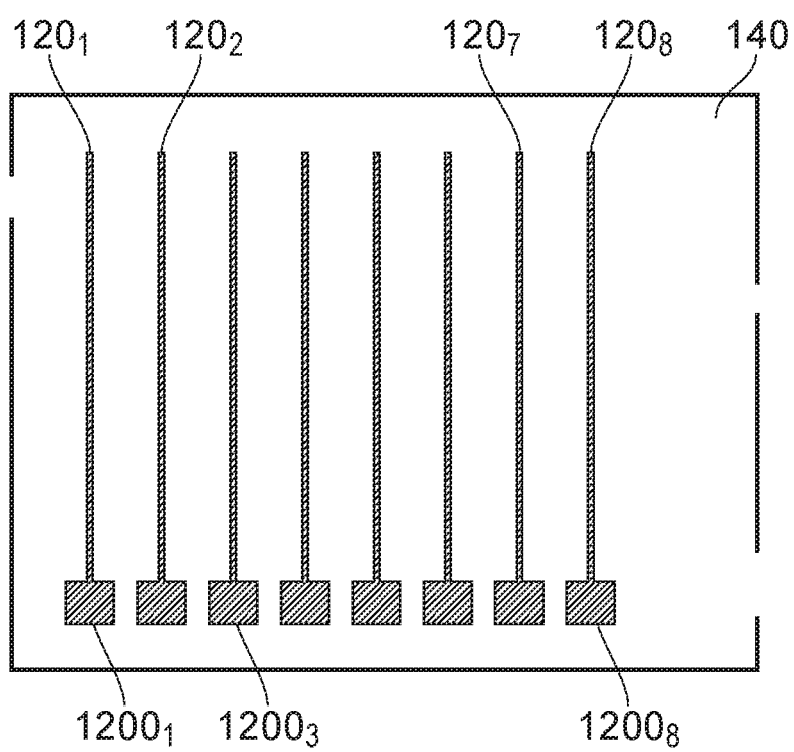
Figure 13:
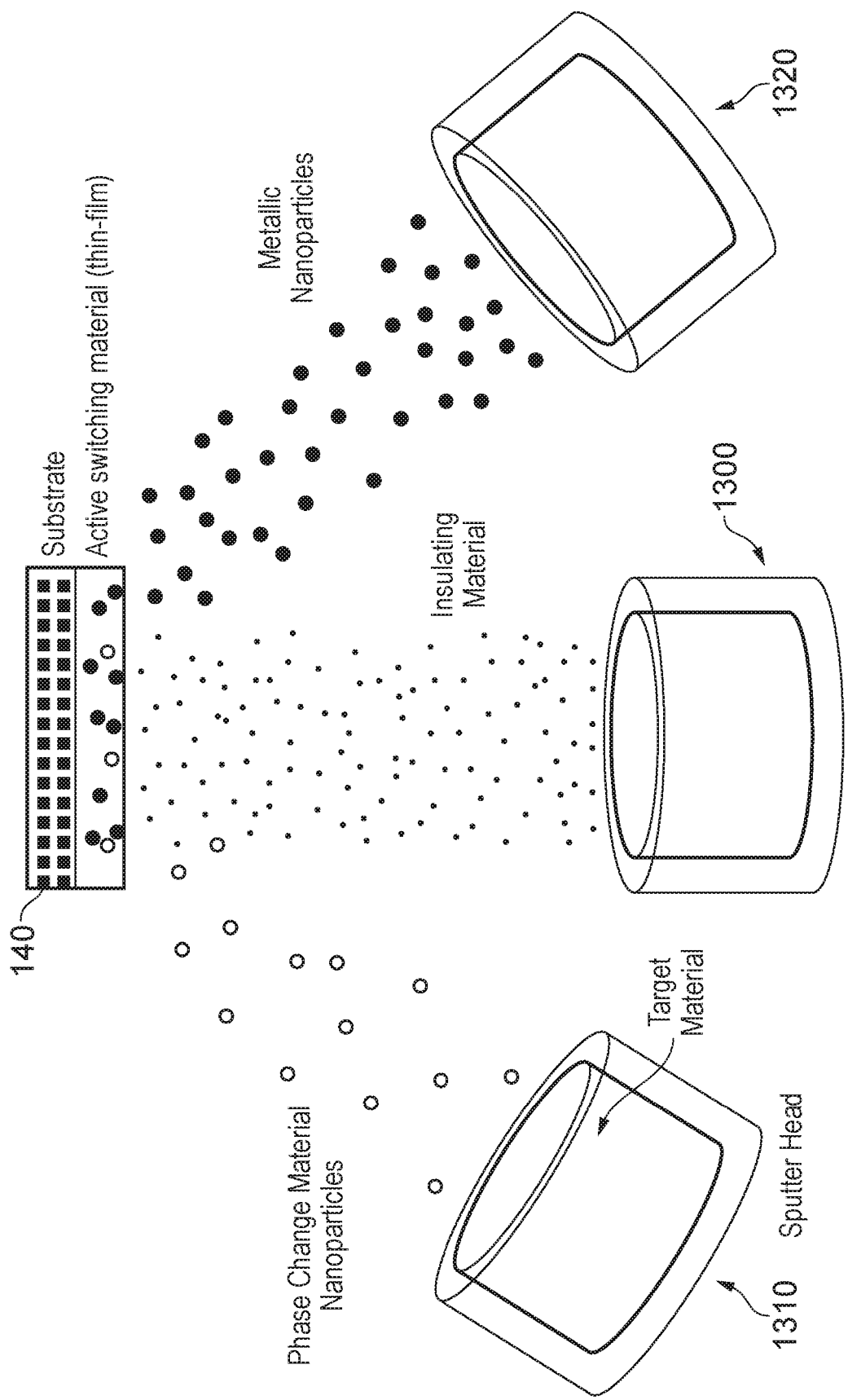
Figure 14:
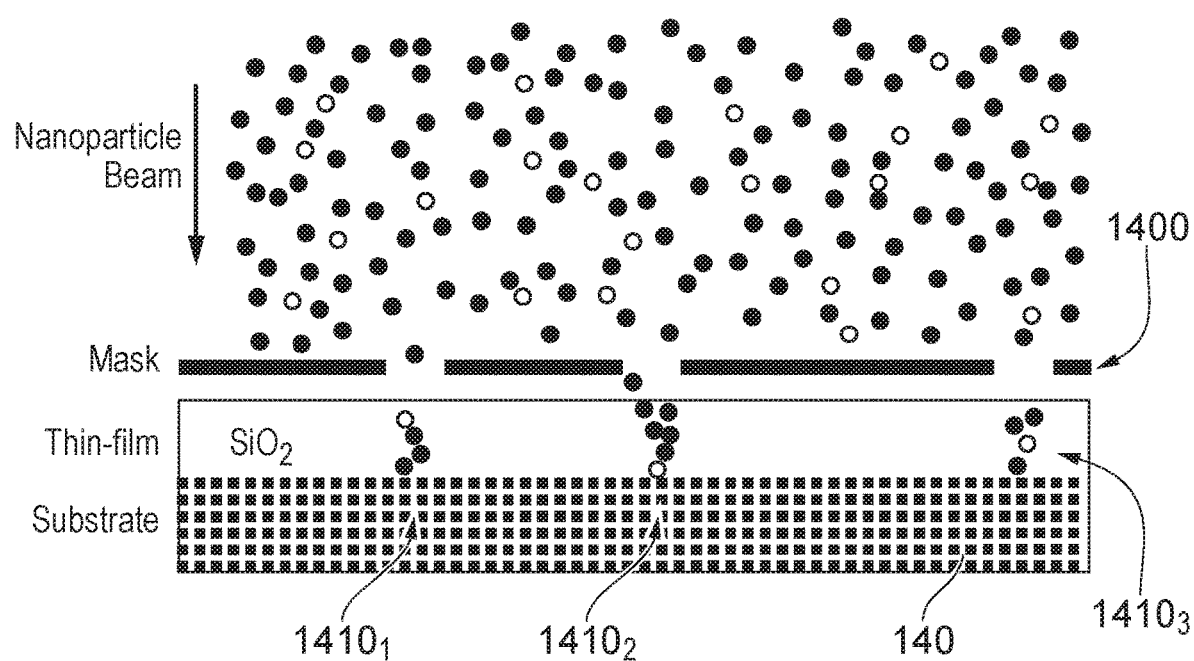
Figure 15:
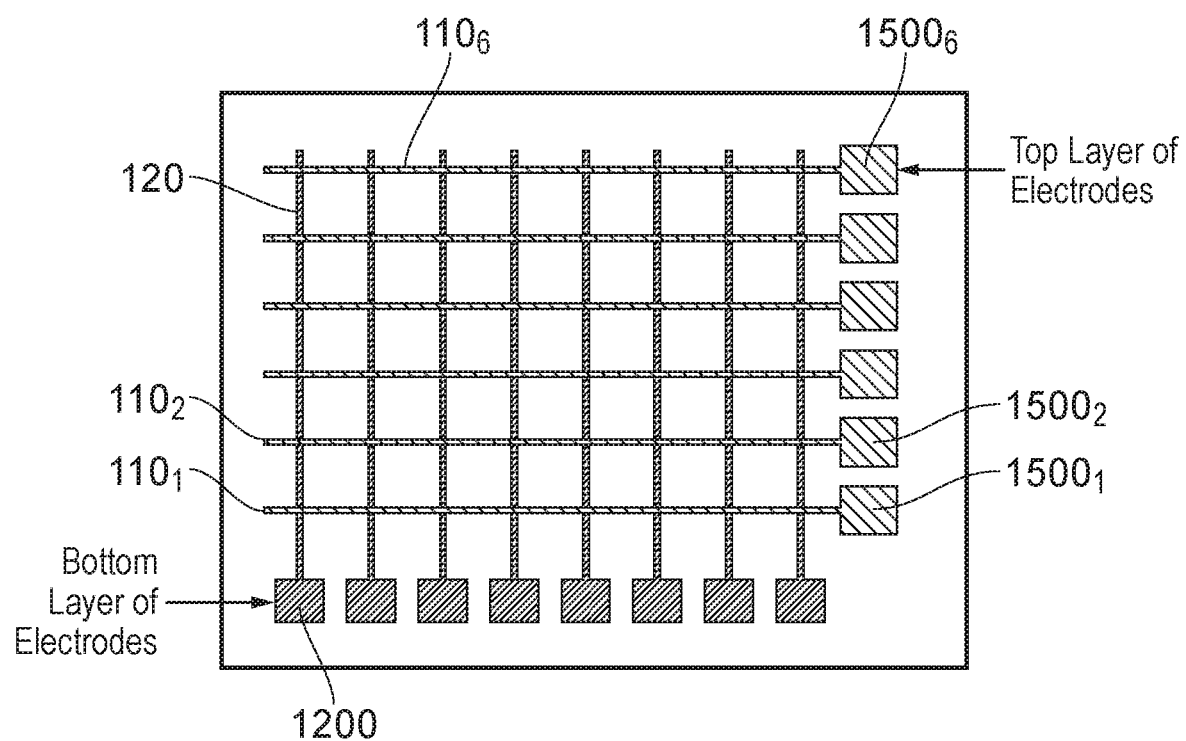
Figure 16:
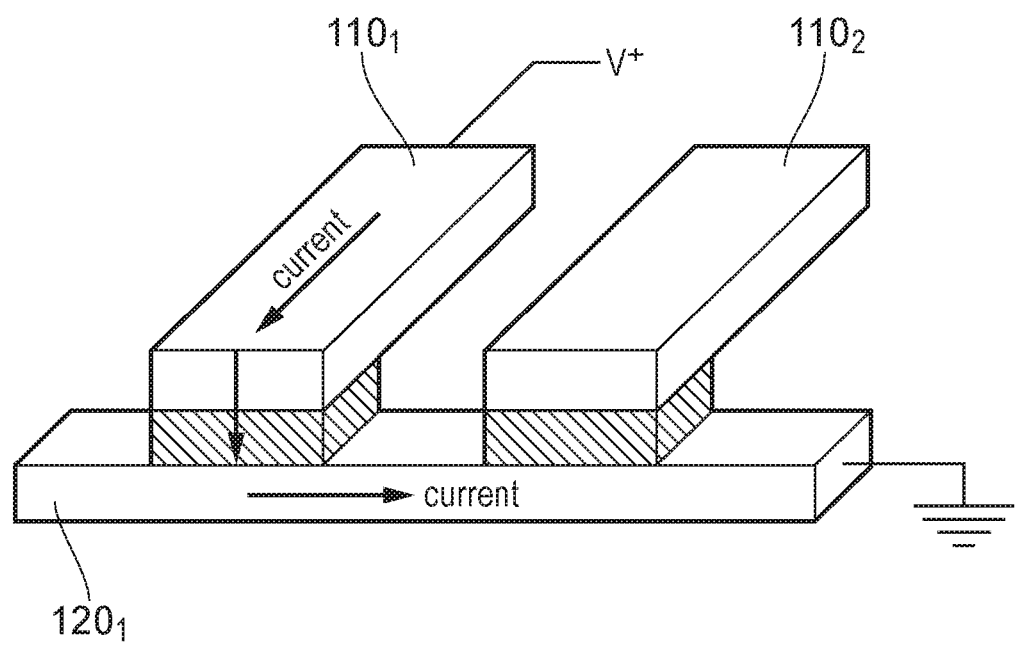
Figure 17:
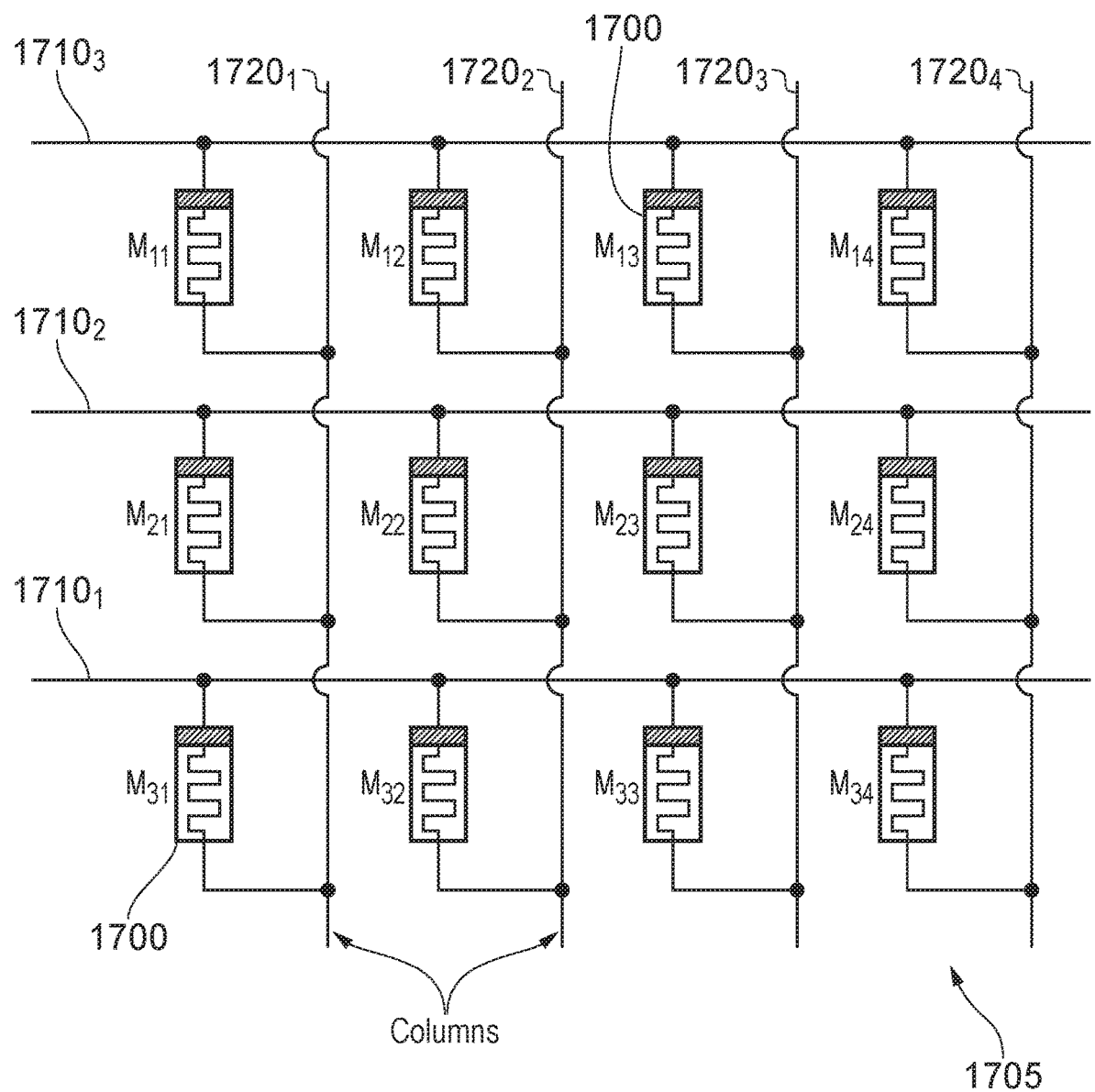
Figure 18:
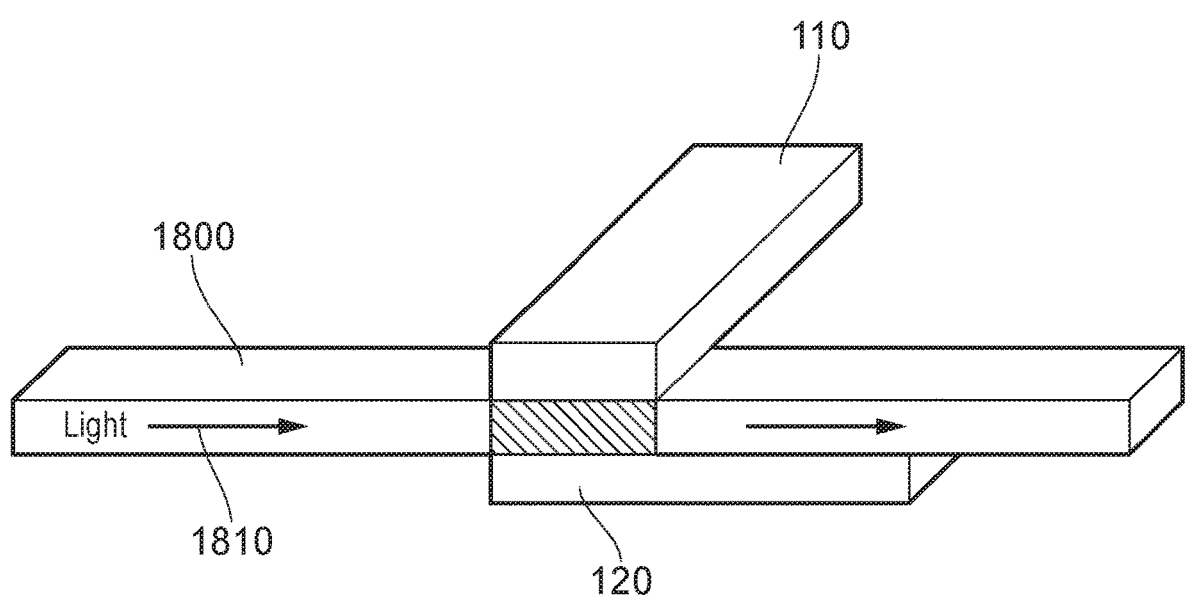
Figure 19:
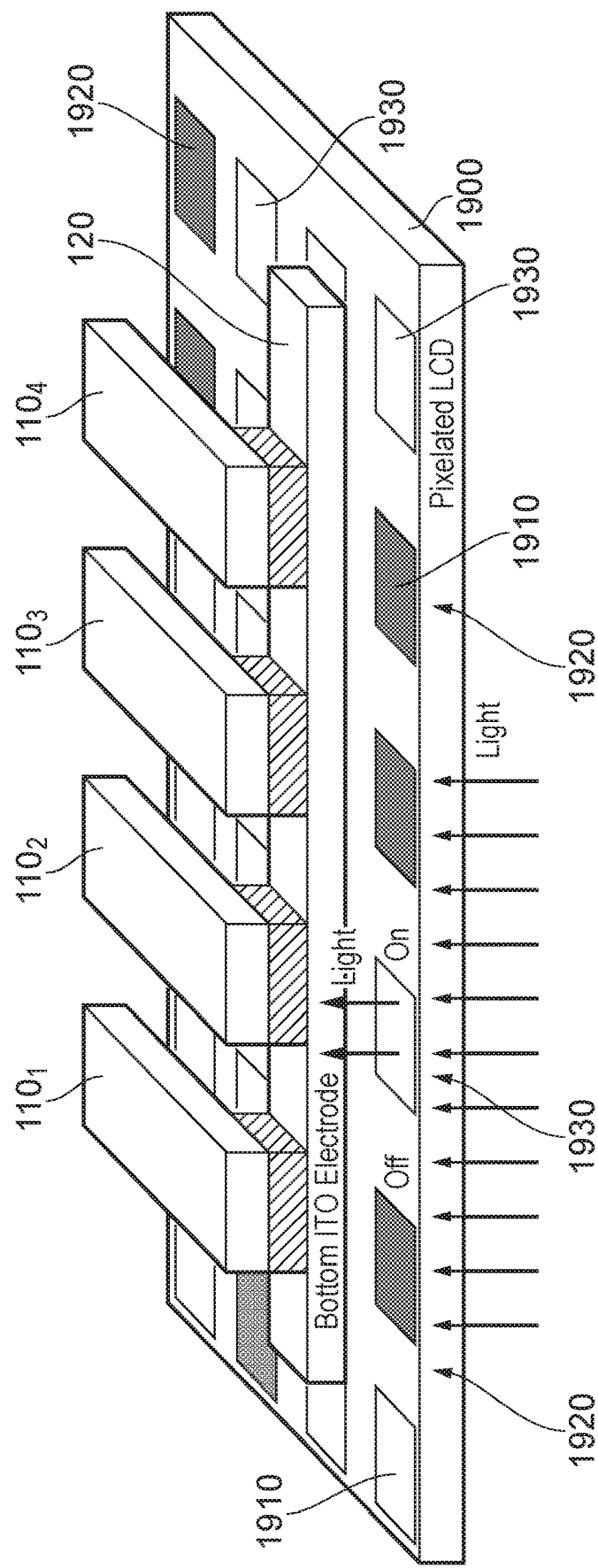
Figure 20:
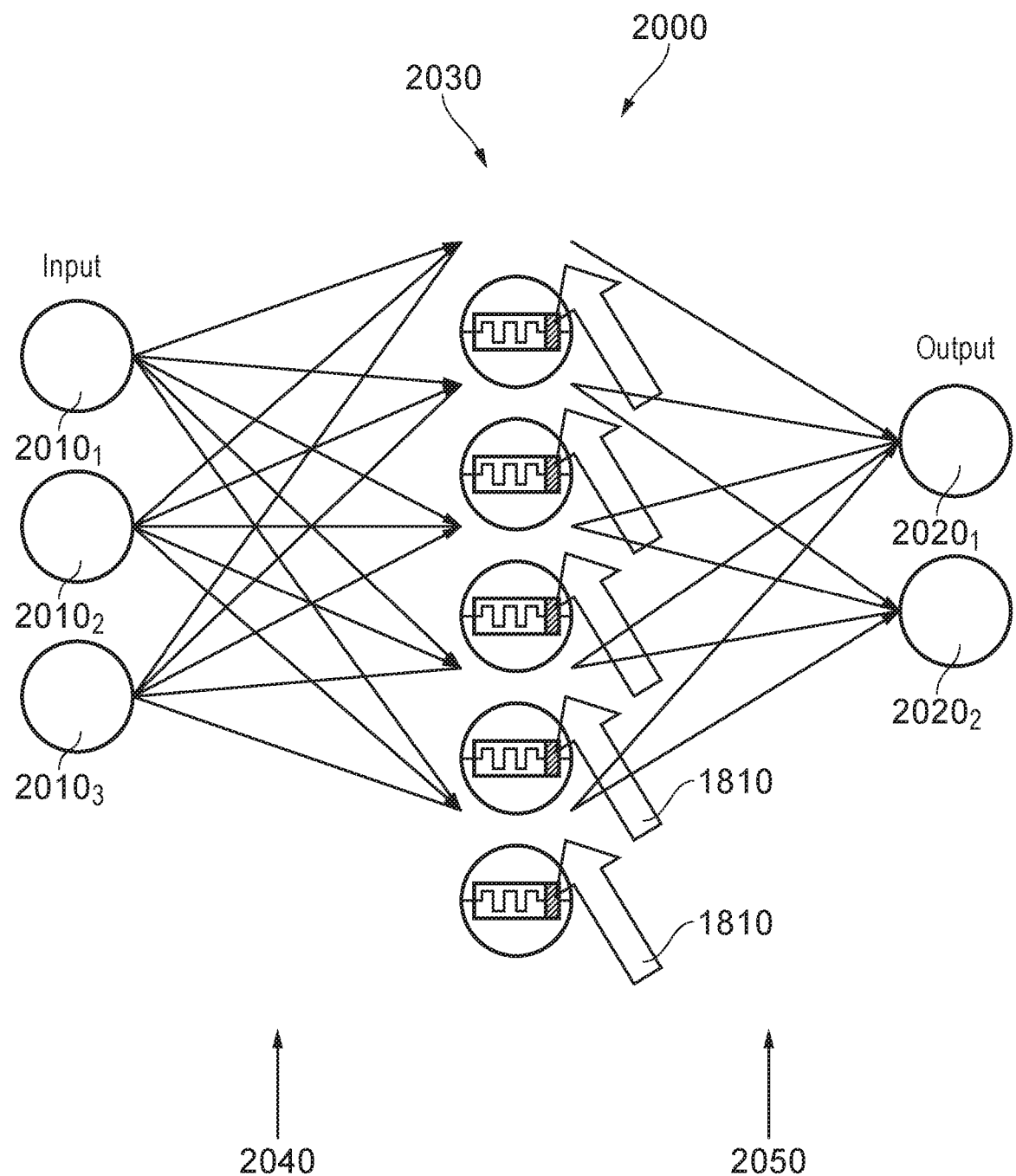
Figure 21:
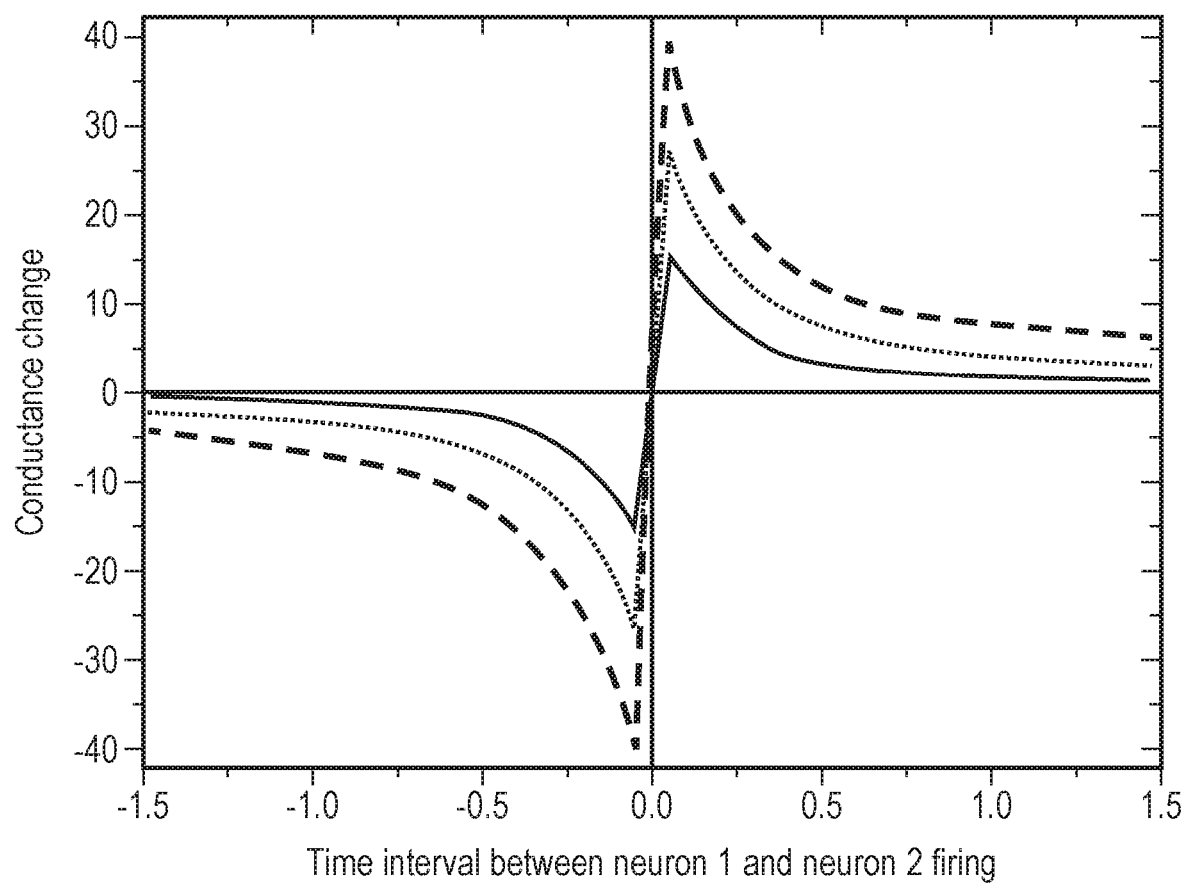
Figure 22:
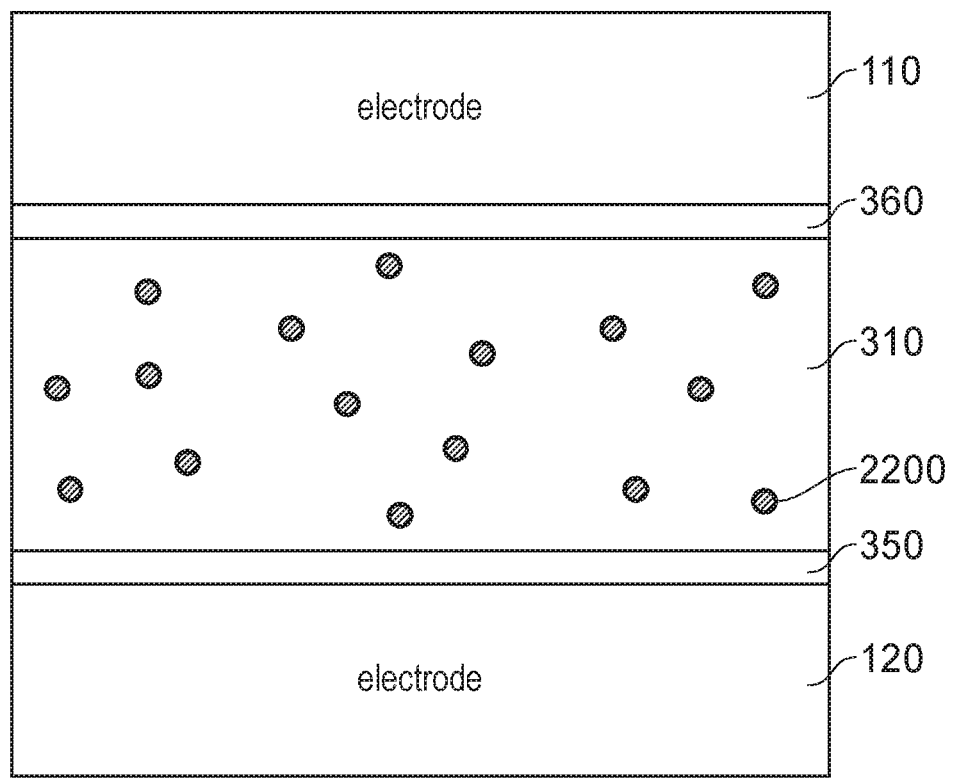

FIG. 4 schematically illustrates how optical illumination of a device can convert a state of phase change material to break conducting pathways;

FIG. 5 illustrates current/voltage properties of a switching device including nanoparticles embedded in an insulating material;

FIG. 6 illustrates an SCLC based mechanism of switching of a device from a high resistance state (HRS) to a low resistance state (LRS);

FIG. 7 illustrates optical cycling of an illumination process;

FIG. 8 illustrates current-voltage sweeps of a switching storage device;

FIG. 9 illustrates optical switching of a resistive memory state before and after optical illumination;

FIG. 10 illustrates a homogeneous percolating network and an inhomogeneous percolating network;

FIG. 11 illustrates a critical volume fraction as evidenced by a sharp increase in conductivity;

FIG. 12 illustrates device electrodes manufactured on a transparent glass substrate;

FIG. 13 illustrates a sputtering process to create an active region;

FIG. 14 illustrates deposition of nanoparticles through a mask to provide localised regions of nanoparticles where inhomogeneous percolative-like electronic conduction occurs;

FIG. 15 illustrates a cross bar device configuration consisting of top and bottom electrodes;

FIG. 16 illustrates two individually addressable cross bar devices including active regions each sandwiched between a respective top and bottom electrode;

FIG. 17 illustrates a schematic view of a resistive memory array using storage devices;

FIG. 18 illustrates an on-chip method of directing illumination to facilitate optical switching of an individual memristor device;

FIG. 19 illustrates an alternative method of optically addressing individual (or multiple) devices;

FIG. 20 illustrates a light tuneable neural network;

FIG. 21 illustrates light tuneable synaptic efficacy curves showing how a connection strength of a synapse changes depending on a time interval between neuron firing and noting the different plotted lines indicate devices with their synaptic plasticity modified; and FIG. 22 illustrates a schematic of an alternative percolating pathway structure in an alternative storage device.

In the drawings like reference numerals refer to like parts.

Figure 1:
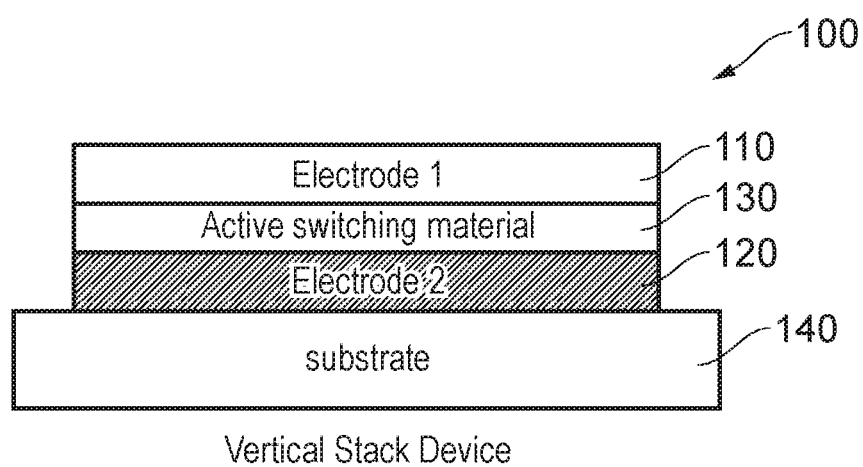
FIG. 1 illustrates an information storage device in a vertical stack configuration.

FIG. 1 schematically illustrates a storage device 100 for storing information. The storage device 100 is illustrated in a vertical stack-like configuration. The storage device for this vertical structured "sandwich" type device includes a first electrode 110 spaced apart from a further electrode 120 with a region 130 of a first material in electrical connection with the upper and lower electrodes. A substrate 140 is utilised during manufacturing (as described in more detail below) to support the creation of the electrodes and active switching material. Optional charge blocking layers can be utilised as described below to help prevent leakage of charge. These are optionally located at the interface between a respective electrode and the intermediate region 130. The region has a height h related to a spacing between electrodes, a width w and a depth d (not shown but extending in/out of the page in FIG. 3).

Figure 2:
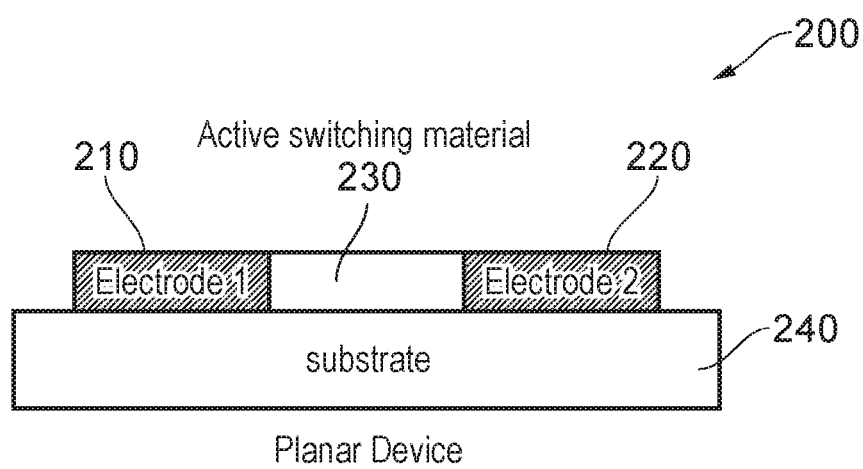
FIG. 2 illustrates an information storage device in a planar side-by-side configuration.

FIG. 2 illustrates an alternative configuration for a storage device 200. The storage device 200 includes a first electrode 210 spaced apart from a further electrode 220 with an intermediate region 230 in between the electrodes and in electrical connection with them. A substrate 240 can be used to support the storage device. Further reference will be made hereinafter to the vertical stack-like configuration illustrated in FIG. 1 but it will be appreciated by those skilled in the art that corresponding embodiments could be utilised interchangeably in the planar side-by-side configuration shown in FIG. 2.

Figure 3:
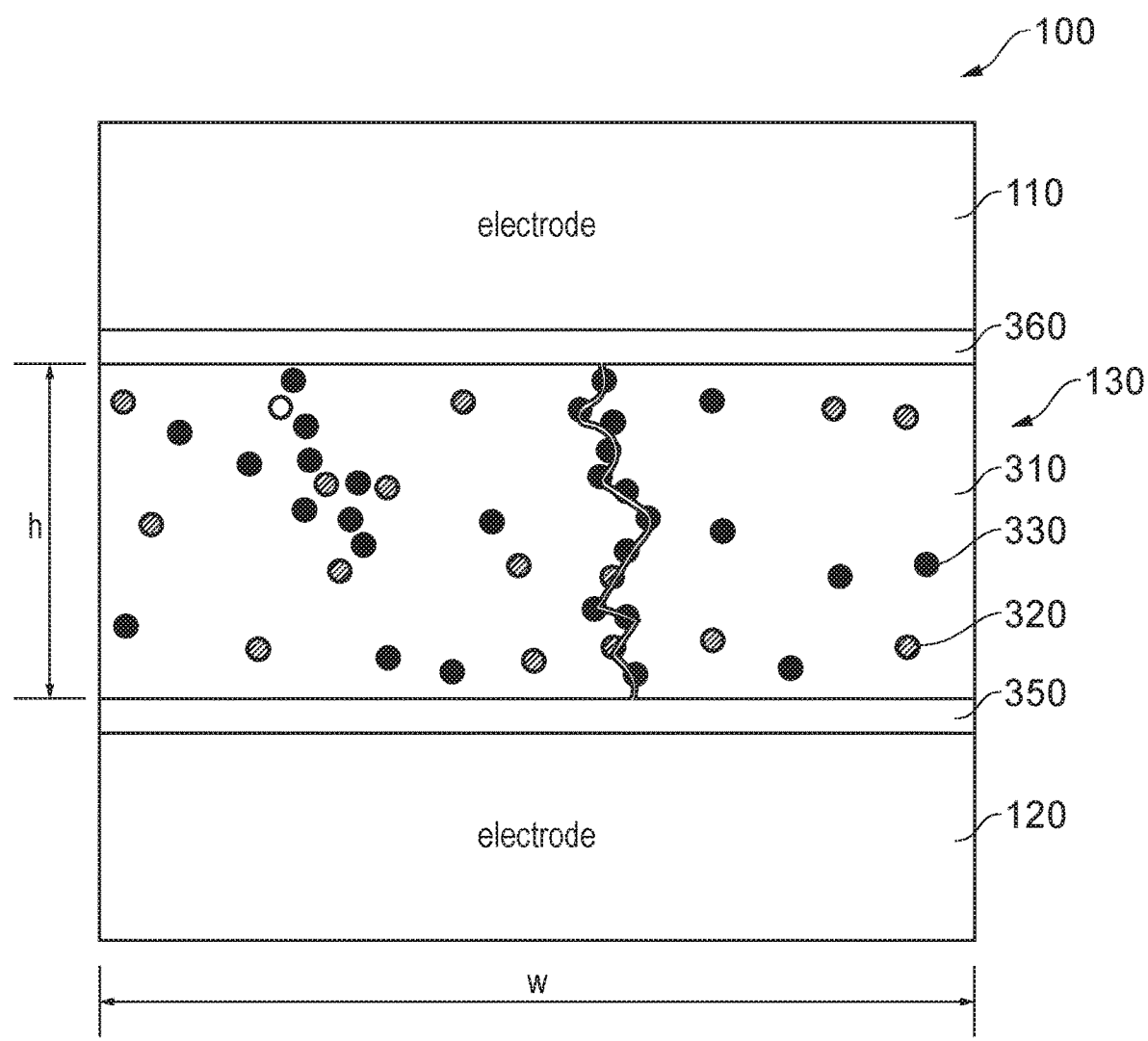
FIG. 3 illustrates a schematic of a percolating pathway structure in a storage device.

FIG. 3 helps illustrate the storage device 100 illustrated in FIG. 1 in more detail. As shown in FIG. 3 the upper electrode 110 of the storage device 100 is spaced apart from a further electrode 120. As illustrated the space between electrodes includes a region 130 of a first material 310. Within the first material 310 are embedded particles 320 of a first type and particles 330 of a second type. The material 310 and the elements 320 that are in the material provide an active region.

An optional charge blocking layer 350 is provided at the interface between the bottom electrode 120 and the active region 130. A further optional charge blocking layer 360 may additionally or alternatively be provided between the active region 130 and upper electrode 110. These help reduce risk of leakage of charge as described hereinbelow in more detail.

The material 310 of the region between the electrodes is an electrically insulating material. The particles 320 of the first type are changeable particles. That is to say the particles are particles of a material that has at least one electrical property that is reversibly changeable responsive to absorption of incident electromagnetic radiation. The particles 330 of the second type are particles of a material having charge storage capability. That is to say they have the ability to store charge.

The material 310 between the electrodes behaves as an electrically insulating matrix material having different amounts of two or more nano particle types. The matrix material shown in FIG. 3 is a transparent glass $SiO_2$. It will be appreciated that other transparent materials such as PMMA or the like could optionally be utilised. Alternatively, the matrix material may be an organic or inorganic based material.

The changeable particles are small nanoparticles having a diameter of around 5 to 100 nanometres. The changeable particles have at least one electrical property that is reversibly changeable responsive to absorption of incident electro magnetic radiation. The particles illustrated, and given by way of example, in FIG. 3 are particles of a phase change material. Aptly the particles are chalcogenide material. Aptly the particles are $Ge_2Sb_2Te_5$ (GST) or the like. It will be appreciated that other particles that have an electrical property that can be changed by absorption of electromagnetic radiation may be utilised according to certain embodiments of the present invention. The particles are an example of a changeable element that has at least one electrical property that is reversibly changeable responsive to absorption of incident electromagnetic radiation. Other changeable elements are molecules or quantum dots or complexes or the like. GST exhibits very large orders of magnitude change in electrical conductivity under optical illumination. The effect is reversible by illumination with light of different intensity and exposure duration. Such details are conventionally well known as fast optical switching elements in re-writable DVD and Blue Ray technology. They have been demonstrated with switching speeds in the nano and occasionally femtosecond range. Their details are not expanded upon in this patent specification for the sake of brevity. For the avoidance of doubt, it is to be understood that certain embodiments of the present invention include other materials that can undergo changes in conductivity or changes in their charge storage properties or resistance under optical illumination. For example, photo redox molecules and molecules/polymers/graphene that can undergo reversible changes in the conductivity upon exposure to light (e.g. materials that exhibit photo doping). According to certain embodiments of the present invention the effect is reversible by using light of different wavelength or polarisation.

It will be appreciated that the electromagnetic radiation which is absorbed could have a broad range of wavelengths according to the changeable particles that are embedded (or otherwise provided) in the insulating matrix. Aptly the electromagnetic radiation comprises optical light in the wavelength range 300 to 830 nm. The electrical property is switchable responsive to incident electromagnetic radiation in less than 60 seconds between a first electrical property state and at least one further electrical property state. In certain embodiments of the present invention the switching occurs in less than 300 ns. In certain embodiments of the present invention the switching occurs in less than 30 ns.

As illustrated in FIG. 3 in addition to the GST particles 320 a further type of particle is embedded in the insulating material 310. These particles are of a material that has charge storage capability. Such particles act like an impurity trap state when embedded into a matrix material. Charge storage capability of a particle, quantum dot, molecule or complex refers to the ability of those elements to store charge. Charge storage capability refers to the injection of electrons onto embedded particles that act as trap sites or induce trap states in the material around them. The traps act like impurity states within a forbidden energy band of the insulating matrix material. Charge is trapped and de-trapped by applying a voltage via the electrodes 110, 120 which switches the device between a high resistance state (HRS) and a low resistance state (LRS). In the embodiment described with respect to FIG. 3 the embedded particles 330 that provide charge storage capability are metal nanoparticles. In more detail they are gold particles. It will be appreciated that according to certain other embodiments of the present invention other types of metal nanoparticles may be used. For example, silver or palladium or the like. According to other embodiments of the present invention semi conducting oxide nanoparticles may be utilised. For example, zinc oxide or titanium oxide or hafnium oxide particles may be utilised. These particles 330 that have charge storage capability have electronic properties that are either conducting or semi conducting. It will be appreciated that according to certain embodiments of the present invention the changeable particles 320 also have charge storage capability. The optically switchable/changeable particles switch electrical properties depending on material and device architecture used. Pool-Frenkel, Schottky emission, Space Charge Limited Current (SCLC) conduction and/or interface effects such as Fowler-Nordheim tunnelling may all contribute to the effect in differing amounts. Switching involves the charging and discharging of the embedded conducted particles that act like impurity states within the forbidden band gap.

Figure 4B:
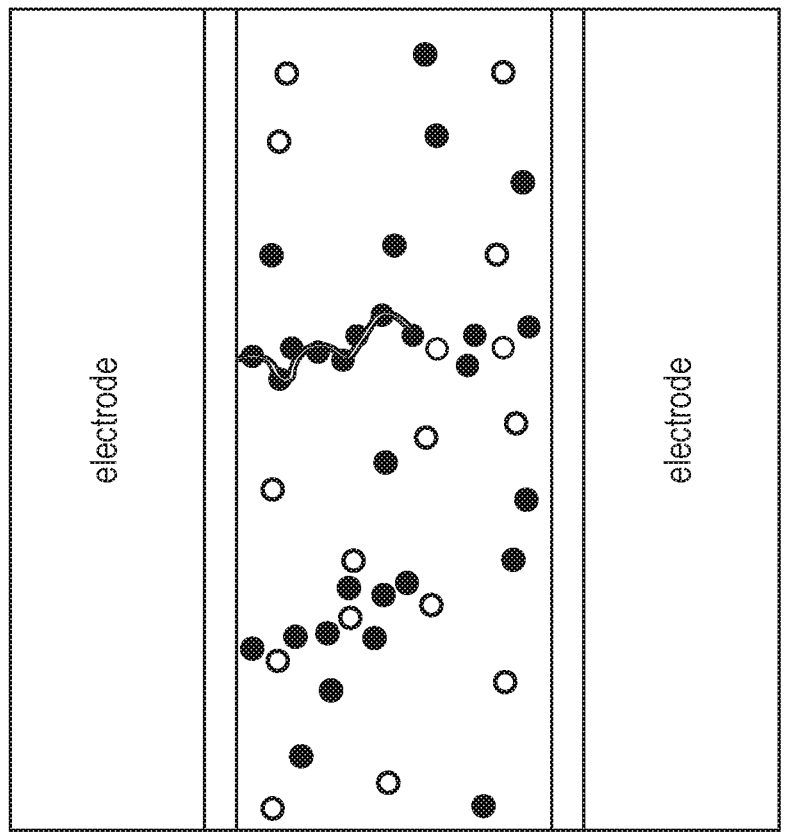
Figure 4A:
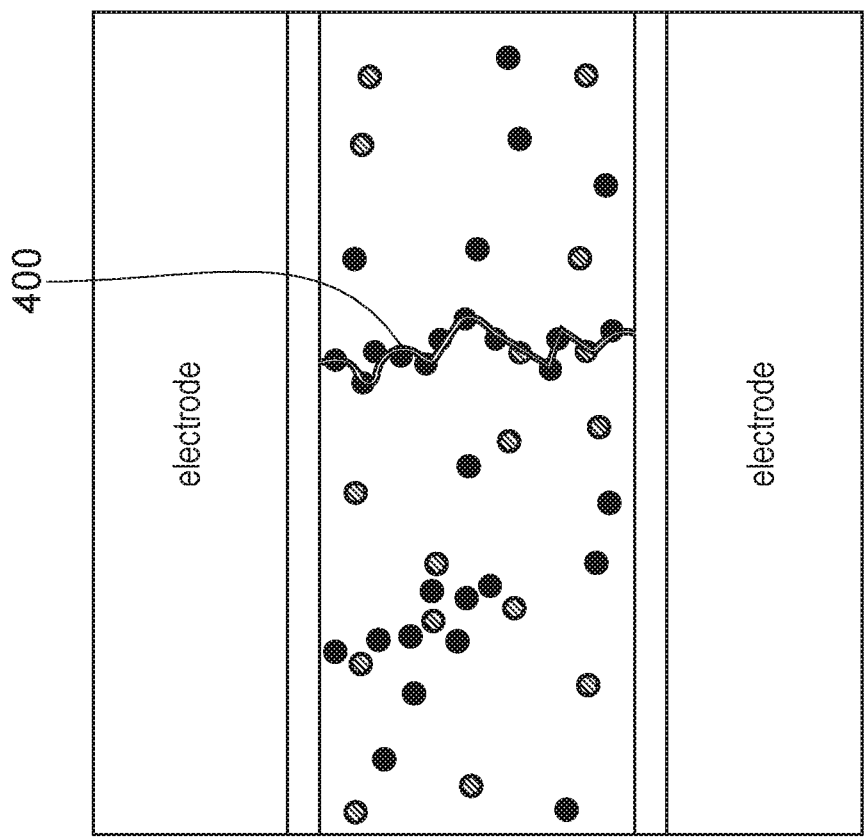

FIG. 4 helps illustrate the storage device 100 shown in FIG. 3 before optical illumination (FIG. 4a) and after optical illumination (FIG. 4b). As shown in FIG. 4a, and indeed FIG. 3, before optical illumination of the device the state of the phase change material nanoparticles is conducting. This helps provide at least one conducting pathway 400 which provides a corresponding conductivity between electrodes. Likewise, this provides a corresponding charge storage property for the storage device. By contrast after optical illumination the state of the changeable particles 320 is altered. In the embodiment illustrated in FIG. 4 the changeable particles 320 are GST particles that are changed by optical illumination to be electrically insulating. This breaks the conducting pathway which has a consequential effect on the devices conductivity and memristive charge storage properties.

As mentioned above the current voltage properties and resistive switching properties of devices containing the embedded changeable particles are responsive to a charge trapping mechanism. The mechanism can include a Space Charge Limited Current (SCLC) effect involving charge injection onto the metal (or semi conducting) nanoparticles which act as a broad band of localised impurity levels within the forbidden band of the insulator 320. FIG. 5 helps illustrate current voltage properties of a resistive switching device made from nanoparticles embedded in an insulating material. This helps illustrate a typical current voltage hysteresis loop demonstrated by storage devices according to certain embodiments of the present invention.

As illustrated in FIG. 5 in sequence s1 the voltage increases from output 0.0 to 1.1v causes a first steady increase in the current. However, at a higher potential an abrupt switch occurs to a much larger device current that coincides with a low resistance state (LRS) of the device. This may be thought of as an ON state. In sequence s2 and s3 the ON state is maintained until a sufficient enough negative potential (illustrated in FIG. 5 as minus 1.0V) the device current transits to a low current value that coincides with a high resistance state (HRS). This may be thought of as an OFF state. In sequence s4 the device remains in the OFF state until a sufficient enough positive potential is applied again in sequence one and the process repeats itself.

FIG. 6 helps illustrate a switching mechanism for a device switching from the HRS to the LRS state at positive potentials. In the HRS to the LRS transition conduction is initially ohmic (with I proportional to V) at low voltage due to current being mediated by thermally generated pre-carriers. At higher voltage, charge injection begins to dominate and SCLC effects occur. Charge injection and trap filling onto the nanoparticles also commences and the rate of current increase changes to I is proportional to $V^2$. At voltages higher than the trap free voltage limit (VTFL) there is a steep increase in current (I is proportional to $V^a$) indicating the point at which the last trap is filled. At potentials above this the current reverts to a lower exponent power law (I is proportional to $V^2$) since all of the traps are full. This is the trap-free SCLC regime. At slightly higher potentials the device is fully in the low resistance state with ohmic conduction (I is proportional to V). In the low resistance state the conduction is mediated by hopping conduction (thermally excited) over a shallow barrier into a conduction band with as well, a component of interparticle electron tunnelling. The device stays in the low resistance state until a sufficient enough negative potential is applied which removes the trapped electrons causing the device to switch back to the HRS state.

Optical switching of each storage device is thus responsive to disruption of conducting pathways within the material. Modification of the energy of trap states or a reduction in a number of trap states may optionally also play a role. Optical illumination of the device causes the phase change nanoparticles to switch from high conductivity to low conductivity. This action breaks some of the pre-existing conducting pathways in the material. This causes two effects.

Firstly, the device switches from a higher conducting state to lower conductance state since there are fewer connected pathways (or none) that bridge across the two electrodes (and any charge blocking layer) and also a volume ratio of the higher conductive elements to the insulating matrix is lower. This effect can be referred to as an opto-electronic switch since if a resistance in the OFF state is sufficiently high it can act as a ON/OFF switch. This is illustrated in FIG. 7.

Secondly, the resistive switching properties of the device change because charge injection into the device and the charge storage capability of the nanoparticles is lower because there are now a small number of conducting nanoparticles in the material. This is illustrated in FIG. 8 by considering the set of curves at different nano particle concentrations and considering a difference between an I-V curve with large resistance OFF/ON ratio and an I-V curve at a lower nano particle concentration. The I-V curve of a device with lower nano particle concentration has both lower device conductance and a low resistive OFF/ON ratio. This effect may be referred to as a memristive opto-electronic switch. This effect can be used as a mechanism to optically tune learning properties "synaptic plasticity" of memory devices and neural networks (this is discussed in more detail hereinafter).

FIG. 8 also helps illustrate current-voltage sweeps of a resistive switching device showing how both device conductance and resistance OFF/ON ratio is affected by nano particle concentration. The maximum Res OFF/ON ratio at the critical volume fraction Vc is shown by the solid curve 800 in FIG. 8. Resistive switching is not observed at either high or low nano particle concentration.

FIG. 9 helps illustrate optical switching of a resistive memory state. Before optical illumination as shown in the upper part of the figure (illustrated with respect to the curve 900) the device passes higher current (i.e. it is more conducting) and has a wider separation between the upper (ON state) and lower branches (OFF state) of the I-V hysteresis curve 900.

After optical illumination the device current is diminished and the separation between the branches decreases as illustrated by the lower curve 910 in FIG. 9.

Figure 10A:
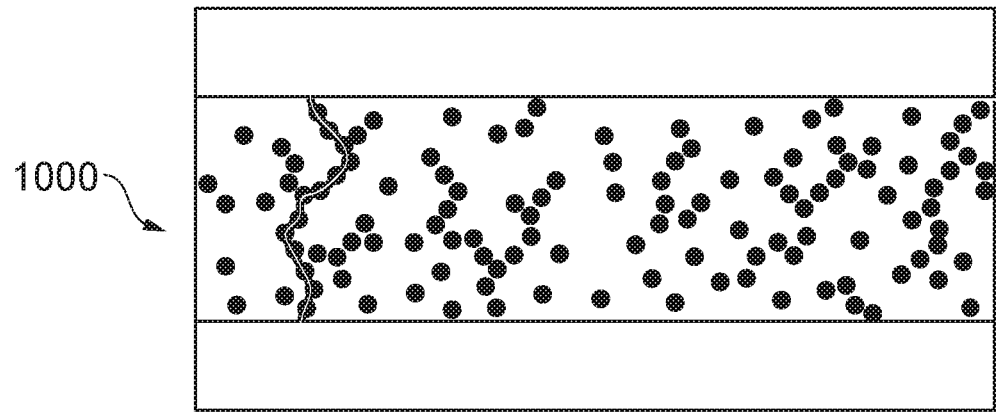
Figure 10B:
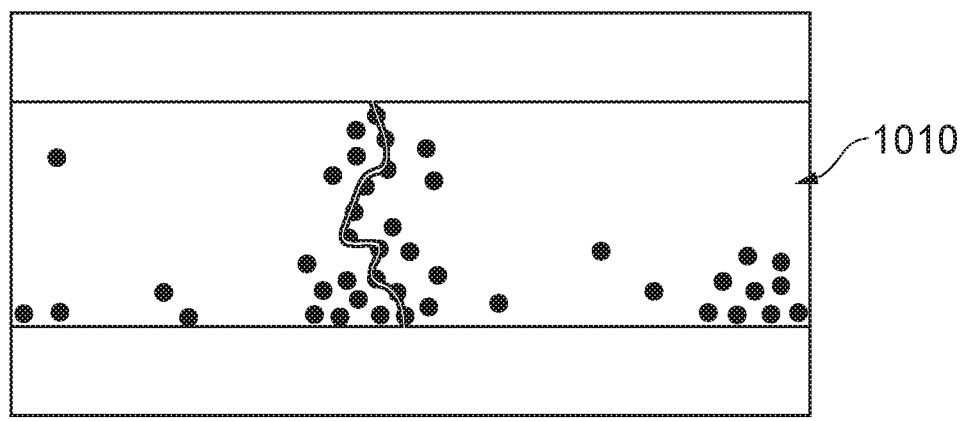

FIG. 10 helps illustrate two of the possible types of classification of percolating networks. Such networks can optionally be established in the active region 130 according to certain embodiments of the present invention. The two types shown are classified depending upon their morphology and certain embodiments of the present invention are applicable to either classes of percolating networks provided by the active region. FIG. 10*a* illustrates a homogeneous percolating network 1000. In such homogeneous percolating networks embedded particles are randomly distributed. This is the type of percolating network shown in FIG. 3. By contrast FIG. 10*b* illustrates an active region (between electrodes) which is arranged as an inhomogeneous percolating network. In such inhomogeneous networks the embedded particles have a non-random distribution caused by either the method of their deposition or interaction between the particles themselves or between the particles and the matrix material or in other ways. As illustrated in FIG. 10*a* in a homogeneous network one or more connected conducting bridges can form at a sufficiently high particle volume fraction. In an inhomogeneous percolating network shown in FIG. 10*b* the particles are not randomly distributed but have some degree of order present either through an interaction with the particles themselves or because of an interaction between the particles and the matrix or because of a manufacturing step used or a combination of such features. FIG. 10*b* illustrates an inhomogeneous percolating network that forms because of a clustering effect and a preferential distribution of particles on the bottom electrode are provided. Various techniques providing homogeneous percolating networks or inhomogeneous percolating networks are described hereinbelow and it will be appreciation that certain embodiments of the present invention use an active region with a homogeneous percolating network or use an active region with an inhomogeneous percolating network. In the inhomogeneous networks clustering effects can be in the height or width or depth dimensions or a combination.

FIG. 11 illustrates a critical volume fraction (Vc). The metal volume fraction is defined as a volume of metallic elements divided by a volume of the insulating matrix material. As illustrated in FIG. 11 there exists a critical volume fraction (Vc) at which the device conductance abruptly increases. This is due to the formation of conducting pathways that bridge between electrode 1 and electrode 2 in the percolating network of the active region between electrodes. Above the critical volume fraction the conductivity weakly increases as the metallic volume fraction increases due to the addition of more conducting pathways. In the case of an inhomogeneous percolation threshold, where the particles are not randomly distributed, the volume fraction can be much lower than that of a homogeneously distributed network.

The volume fraction of metallic conducting elements plays a role in the resistive switching of properties of the device. At both low and high nano particle volume fractions, resistive switching may not occur. At low nano particle loading there are not enough nanoparticles present to provide sufficient charge storage. At high nano particle loading the conductivity of the material is too high and charge leaks away. At the critical volume fraction Vc which coincides with formation of conductive bridges across the device electrodes, the electronic resistive switching properties of the device is optimised. Certain embodiments of the present invention utilise an active region including elements in a matrix at or close to the critical volume fraction. It is not necessary for pathways to percolate directly from one electrode to another to form a complete conducting pathway. It may optionally be sufficient that the pathways are present so as to provide a means of a conducting pathway to particles/charge traps within the insulating matrix that stores charge.

Fabrication of a Vertical Structured Device

Certain embodiments of the present invention provide a method of fabrication of a storage device. The fabrication process for a vertical structured "sandwich" type storage device of the type illustrated in FIG. 1 is described in more detail below.

For situations in which light illumination that will cause switching of a storage device is from underneath, a substrate needs to be transparent and have one side coated with a transparent conducting material. The substrate can be a thin sheet of transparent glass ($SiO_2$) 140. Aptly as illustrated in FIG. 12 the substrate 140 is a transparent glass sheet having a thickness of between 0.2 and 1.0 mm thick. Aptly as illustrated in FIG. 12 a 0.5 mm thick glass sheet is utilised. This is initially coated with an electrically conducting and transparent thin film. The film (not shown in FIG. 12) can optionally be an Indium Tin Oxide coating (ITO). This film is patterned according to conventional techniques to provide a set of spaced apart bottom electrodes. These are usable to electrically access individual devices as will be described hereinbelow in more detail. Optionally, as illustrated in FIG. 15, a cross bar architecture is utilised. A cross bar architecture includes parallel lines of spaced apart bottom electrodes and parallel lines of spaced apart top electrodes that are orthogonal to the set of bottom electrodes. The top and bottom electrodes cross over one another forming a vertically structured device with the active switching material sandwiched between the top and bottom electrodes. The active switching material can be deposited as a single thin film or patterned using photolithography or other patterning methods. If such a cross bar architecture is used the bottom transparent ITO layer is patterned to provide electrodes 120 as thin lines or strips extending from contact pads $\mathbf{1200}_{1\ldots8}$. The contact pads are for external wire binding from the circuit board or chip carrier to a chip. As illustrated in FIG. 12 the contact pads can be large square pads.

The ITO coated glass substrate can be made by depositing ITO directly on to glass using a conventional RF magnetron sputtering technique. Photolithography is used to pattern the electrodes and contact pads for the substrate. ITO coated glass films can be optionally purchased directly from an external supplier such as Delta Technologies USA and then patterned via an etching procedure. Optionally a process of deposition of AZ5214 (image reversal photoresist) resist by spin coating at 3000 rpm for 20 seconds is followed by using a patterned mask perform exposure of resist to light. Unwanted ITO region is then etched using Ferric chloride at 70° C. for 20 minutes.

It is to be noted that for a device in which light illumination occurs from above instead of underneath the top electrode material should be transparent. In this case the substrate material 140 does not need to be transparent and can optionally be a silicon wafer. Such a silicon wafer can be provided with a thin oxide layer on its surface 50 nm to 1 um thick to help prevent short circuit of the device to the semiconducting silicon of the substrate. Likewise, for storage devices in which light illumination occurs from above the bottom electrode 120 material does not need to be transparent and can be made from a conventional metallic option such as gold or aluminium or chromium.

Subsequent to the formation of the substrate and bottom electrode/s 120 a charge blocking layer may optionally be provided. This can be achieved by the insertion of a thin film tunnel barrier provided by a material with a sufficiently large band gap (e.g. $SiO_2$ of the like) in which electrons can tunnel through the barrier via a Fowler-Nordheim tunnelling mechanism only if a sufficiently large enough potential is applied (across the electrodes). Insertion of a charge blocking layer at the interface between the bottom electrodes and the active region of indeed between the active region and the top electrode array or both can provide improved data retention rates by stopping any possible leakage of charge from trapped sites in the active region.

Once any optional charge blocking layer 350 is provided over the electrodes, or if no charge blocking layer is desired, the active switching material including the two types of nanoparticles previously described embedded within an electrically insulating (dielectric) and transparent material can be deposited using one of multiple optional techniques. These techniques are selected according to the choice of host matrix material and whether that is inorganic or organic.

Inorganic Matrix Material Provision

If the electrically insulating matrix material is an inorganic material the material should be fully or partially transparent and be electrically insulating. That is to say it should have good dielectric properties with low current leakage. Aptly the inorganic matrix material is glass. The use of an inorganic material can have the advantage of better suitability with conventional semiconductor fabrication and processing techniques. This is because the deposited material is more robust at higher temperature and is more stable when used with solvent or when placed under vacuum conditions. Compatibility with this may be necessary for the deposition of other layers to improve device performance or for the processing of other structures on chip for optical and electronic integration. For example, deposition of optical waveguides to optically address devices are described hereinbelow. It is to be noted that the ultrapure, contamination-free deposition conditions and vigorous standards used in conventional semiconductor fabrication lines also provide for good control of the fabrication conditions enabling less variability in the device characteristics and switching properties. Aptly the insulating matrix material and two different nano particle types used to provide the storage device illustrated in FIG. 3 uses a co-depositing process. Various methods are available to achieve this co-deposition including laser vaporisation, RF or DC magnetron sputtering, high-energy ion sputtering, pulsed arc synthesis, elemental vapour reaction and direct liquid injection vaporisation. To deposit all three materials at the same time a vacuum chamber is used with multiple sources that give directed fluxes of the material onto the sample substrate. Optionally it may be beneficial to have only one active source and alternate the deposition from different sources.

FIG. 13 illustrates a magnetron sputtering process that can be used. In particular FIG. 13 illustrates co-deposition plasma sputtering of an inorganic thin film consisting of a transparent dielectric layer with two types of embedded nanoparticles made from metal and a phase change material. A standard RF sputtering head is used with the target being the desired dielectric material. Aptly this is $SiO_2$. For the deposition of nanoparticles which may include metal and phase change material nanoparticles, a DC magnetron sputtering process uses gas aggregation to form and deposit the small nanoparticle/cluster entities. A suitable commercial system is the NanoGen system from MANTIS Deposition. As illustrated in FIG. 13 a first sputtering head 1300 is used to sputter the insulating material. A further sputter head 1310 is used to sputter the phase change nanoparticles such as particles of GST. A still further sputter head 1320 is used to sputter any desired metallic nanoparticles such as gold nanoparticles. The sputtering process provides the active region over the electrodes 120 on the substrate 140. The active region involves the insulating material with embedded particles.

As noted above certain embodiments of the present invention are applicable to use with homogeneous or inhomogeneous percolating networks as an active region. FIG. 13 illustrates a technique for providing a homogeneous percolating network. The volume fraction of the two types of nanoparticles relative to the amount of insulating matrix material can be controlled during the deposition process to control the volume fraction. Aptly the volume fraction of the phase change nanoparticles relative to the insulating matrix material is less than the volume fraction of the metal nanoparticles relative to the insulating material.

FIG. 14 helps illustrate how the magnetron sputtering process can be modified to provide an inhomogeneous percolating network as an active region. The inhomogeneous percolating network includes formation of inhomogeneous pathways including just a few percolating pathways in the active region. As illustrated in FIG. 14 a mask 1400 is utilised selectively during deposition so that nanoparticles can deposit only in localised sites. This includes the use of an automated sequential deposition procedure that switches between deposition of the insulating material (i.e. $SiO_2$) with no mask present to build up the matrix layer and deposition of the nanoparticles with the mask present. As illustrated in FIG. 14 the result is a thin film that provides the active region in a storage device formed from an electrically insulating material with one or more localised sites 1410 (three shown in FIG. 14) in which the matrix material includes phase change material and metallic particles. That is to say in the localised sites 1410 the active region includes changeable particles that have an electrical property that can be switched via optical illumination and a further type of particles which are charge storage particles. Optionally the changeable particles also have charge storage capability. Optionally according to certain embodiments of the present invention only changeable particles are embedded in the matrix material (that is to say no additional metallic nanoparticles are utilised during a processing stage).

Deposition of nanoparticles through a shadow mask or onto a resist material located on the device itself that contains patterned areas defined by photolithography or e-beam writing, which thus helps give localised regions of nanoparticles where percolative-like electronic conduction occurs. Different masks can optionally be utilised to help control the location of the concentration to thus control the lack of homogeneity of the network. For magnetron sputtering processes co-deposition conditions are including the base pressure of the vacuum system should be lower than $1\times10^{-6}$ mbar. For the deposition of the matrix material (e.g. $SiO_2$ or the like) a standard RF magnetron sputtering head is used. The deposition rate is controlled by an argon pressure (around $1\times10^{-2}$ mbar) and RF power (which is around 80-120 W and aptly is around 100 W). A distance between the sputter target and sample is around 10-20 cm. Aptly the distance is around 15 cm. Using these given values, a typical rate of 1 nm per minute of deposition can be provided.

For deposition of the phase change nanoparticle material such as GST or the like a DC magnetron sputtering method is used utilising gas aggregation. A small amount of hydrogen or methane facilitates the formation of nanoparticle clusters. Since the nanoparticle gas aggregation zone is differentially pumped this does not significantly affect the pressure condition of the main vacuum chamber. Helium pressure gives control of the nanoparticle size. 20 sccm of helium (high purity 99.999%) provides a nanoparticle diameter of around 8 nm. The magnitude of the discharge current helps control the crystallinity of the nanoparticles. 0.3 amps gives a nanoparticle of high crystallinity.

For deposition of the optional metal nanoparticles, for example gold nanoparticles, a DC magnetron sputtering method utilising gas aggregation can be used. The size and deposition rate of the nanoparticles can be controlled via the gas flow of argon and helium. Partial pressures of around $1\times10^{-2}$ mbar and magnetron power around 30-150 W can be utilised. These values produce gold nanoparticles having a diameter of around 5.0 nm.

As noted above various techniques and processes are optionally used to provide the active area of a storage device. Another such optional technique is direct liquid injection methodologies. This provides a convenient method for co-depositing nanoparticles onto a substrate material under vacuum conditions. The technique helps enable liquids containing pre-formed nanoparticles to be injected into a vacuum system and deposited directly onto a substrate. The process helps remove the carrier solvent via a high temperature evaporative process. An advantage of this technique is that pre-formed nanoparticles can be used that are made by conventional and cheaper fabrication techniques. For example, such nanoparticles can be made using chemical methods or pulsed laser deposition approaches. Another advantage of this technique is that both nanoparticle types, that is to say the phase change nanoparticles and charge storage capability particles can be deposited simultaneously. The matrix material such as glass material can also be deposited in the same vacuum system either simultaneously or with a sequential deposition method.

During a direct liquid injection method the phase change material and metal nanoparticles (for example having diameters of around 5-7 nm, are mixed in toluene to give a total concentration of around 10 mg/100 ml. The ratio of the phase change material to the metal nanoparticles can be around 1:5 (by volume). A high purity anhydrous nitrogen can be used as a carrier gas with a flow of 500 sccm. The liquid lines and carrier gas line pressures are set to around 3.5 bar and 2.5 bar respectively. A vaporisation temperature of 100° C. and a liquid flow rate of 0.2 g/min is used to give a homogeneous distribution with minimal clustering.

As noted above whilst certain embodiments of the present invention can utilise an inorganic matrix material to provide an active region, certain other embodiments of the present invention can be based upon the use of an organic matrix material. Use of an organic matrix material can provide an advantage of low cost since processing can occur in room temperature ambient conditions using relatively straight forward conventional techniques such as spin coating or the like. Furthermore since materials with low melting glass transition (Tg) can be used (e.g. poly methyl methacrylate (PMMA) with a Tg around 85-165° C.), annealing can be used to control the film morphology. In particular this can help provide a morphology with an inhomogeneous distribution of percolating pathways. This helps enable optimisation of the optical sensitivity as well as the resistance OFF/ON ratio. The organic matrix material for the optical memristor device is optionally transparent or partially transparent and is electrically insulating. That is to say the material is a good dielectric. One possible material is PMMA.

When using PMMA as a matrix material and using a mixture of GST nanoparticles and metallic nanoparticles of gold or silver or palladium the nanoparticles are dissolved within the insulating matrix material using a solvent such as toluene. The surface of both nanoparticle types can be functionalised with a thin molecular layer to make them hydrophobic (particles can be hydrophobic or hydrophilic depending upon a type of polymer used. For example, particles could be hydrophilic if PVA is used instead of PMMA. A solvent for PVA is water (i.e. a polar solvent). This can be achieved via a long alkyl chain with a functional head group at one end and an anchoring group at the other. This helps aid their dispersion and prevents undesired clustering within non-polar solvents. Pre-functionalised metal nanoparticles of gold or silver of palladium can be purchased commercially from PlasmaChem. Diameters of 5-7 nm can optionally be used. The phase change nanoparticles can be manufactured using a pulse laser ablation process and functionalised so as to aid dispersion in organic solvents. This can be achieved using a number of chemical techniques such as seeded emulsion polymerisation, ligand exchange.

A ratio of the metal nanoparticles to the PMMA material is aptly in the range of 0.03-0.7% vol/vol whilst the phase change material should be less. Approximately in the vicinity of one tenth to one half of this value. The deposition of the nanoparticle/PMMA blend onto the bottom electrode of the device can be carried out by spin coating at 2000 rpm for 30 seconds to make a film approximately 100-200 nm thick. This can be followed by an annealing step at 140° C. for 30 minutes to remove any residual solvent. An additional annealing step including heating at 160° C. for 8 hours can be used to form an inhomogeneous percolating network including discrete clusters of pathways that partially or completely stand between the top and bottom electrode. As an alternative for the deposition of a homogeneous percolating network a higher concentration of the metal and phase change nanoparticles can be used. For example, 20-50% vol/vol and a long annealing step is not required.

Regardless of the technique for providing the intermediate/active region of a first material between the electrodes with particles another optional charge blocking layer 360 may optionally thereafter be provided over the active region.

Next a top layer of the vertical sandwich stack is provided. This can be provided as another layer of patterned ITO material to act as the top electrodes of the device. It is to be noted that as an option a metallic conducting material such as gold or aluminium could also be used as this layer does not necessarily need to be transparent if light illumination is planned to occur from underneath the glass substrate. Similarly, if light illumination comes from above the lower electrode material could also be a metallic conducting material such as gold or aluminium. The upper ITO is deposited over the active region and any optional charge blocking layer with a pattern illustrated in FIG. 15. The electrodes 110$_{1-6}$ illustrated in FIG. 15 are terminated at one end (the right-hand side end shown in FIG. 15) with a pad 1500$_{1-6}$. FIG. 15 helps illustrate the cross over between electrodes and it will be understood that the active regions are provided between the crossing points of the upper and lower electrodes. Aptly the matrix is a thin film layer. However according to certain embodiments of the present invention the layer can be etched. This can be useful when a wave guide is being integrated with the optical switching device.

FIG. 16 illustrates a magnified view of the crossover points between a single lower electrode 120$_1$ and two of the upper electrodes 110$_1$, 110$_2$ with a respective region of insulating material and embedded changeable particles at each cross over location. FIG. 16 thus helps illustrate a view of two individually addressable cross bar devices provided by the active switching material sandwiched between the top and bottom electrodes. The arrows illustrated in FIG. 16 show a current path from a source of high potential ($V^+$) to electrical ground ($V=0$). FIG. 16 thus helps illustrate how a voltage can be applied across spaced apart electrodes and that the region of insulated material and embedded particles is in electrical connection with the electrodes.

Fabrication of a Planar Type Device

As noted above certain embodiments of the present invention can be provided as a storage device having a planar or side-by-side structure. This is illustrated more clearly in FIG. 2. Various manufacturing processes can be utilised to provide such a structure.

For example, in the case of use of an inorganic matrix material and for a device in which light illumination occurs from underneath the substrate the substrate material is transparent. Aptly a thin layer of transparent glass (for example around 0.5 mm thick) can be utilised. Alternatively, if light illumination is to be expected from above the substrate does not need to be transparent (although it can be) and can be a silicon wafer with an optional oxide surface layer. Other non-conducting materials could of course be utilised in such circumstances.

Planar electrodes are deposited on top of the substrate. The electrode material can be a metal such as gold or platinum aluminium or chromium or a semiconductor with a band gap that is not too large so that conduction occurs at room temperature. Aptly transparent ITO can be used. It is to be noted that the electrode material does not necessarily need to be transparent in the case that light does not need to go through the electrode material but instead interacts with the material between the two electrodes in this planar side-by-side configuration. Depending upon a size of electrode the electrodes can be patterned by various techniques including photolithography, e-beam writing or nanoimprint lithography. The size of the region between the two opposite electrodes can be in the range of 40-210 nm. Aptly the width direction between electrodes is in the range 50-200 nm. With such a width, large electric fields are not needed keeping the operation voltage of the device small. Other widths could of course be utilised.

The inorganic active switching material is manufactured in a same or similar methodology to those optionally described hereinabove for the vertical "sandwich" device type. For example, a system used for manufacturing can include $SiO_2$ as the insulating matrix material, GST as a phase change material and gold nanoparticles. This provides a storage device with a homogeneous percolating network arrangement.

For certain embodiments of the present invention an organic matrix material can be used to form the active area between the side-by-side but spaced apart electrodes of the type shown in FIG. 2. The device architecture including substrate and electrodes of such planar devices containing an organic matrix can be the same or similar to that described hereinabove with respect to the inorganic matrix material planar device type. The active switching material can be the same or similar to that described above for the vertical "sandwich" device type. For example, the active switching material can include the insulating dielectric PMMA containing disperse phase change material GST nanoparticles and gold nanoparticles.

The deposition of the nanoparticles/PMMA blend onto the bottom electrode of the device can be achieved by spin coating at 2000 rpm for 30 seconds to make a film approximately 100-200 nm thick. This can be followed by an annealing step at 140° C. for 30 minutes to remove any residual solvent. A high concentration of the metal and phase change nanoparticles can be utilised. For example, 20-50% vol/vol can be used to produce a device with a homogeneous percolating network. The location of the nanoparticles is random.

As an alternative to depositing films an aerosol assisted chemical vapour deposition (AACVD) process can be utilised. Using such a process the desired nanoparticles can be deposited along with polymer precursors to form a nanoparticle embedded polymer thin film. An advantage of this technique is that the deposition of the nanoparticles and the polymer occur in a single process.

Formation of an inhomogeneous percolating network including conductive pathways through the matrix running parallel to the substrate can be achieved using a large range of self assembly approaches. For example, this includes but is not limited to laser directed assembly and use of block-copolymer domains.

Use of a sandwich or vertical stack type device like that illustrated in FIG. 1 has the advantage that it provides easier deposition and patterning of the top and bottom electrodes and offers good scalability for high-density integration. Use of an inhomogeneous percolating network can provide a greater optical sensitivity and a larger resistance OFF/ON ratio. Use of a homogeneous percolating network has the advantage that it is easier to manufacture.

It is to be noted that whilst the inhomogeneous percolating pathways illustrated in FIGS. 4a and 4b include pathways bridging a whole height between the electrodes (or any included charge blocking layers) an alternative is to provide pathways which do not traverse all the way between the electrodes.

Data can be written to the storage devices described hereinabove in at least two ways. Either via electrical means or optical means. Writing data using electrical means includes providing voltage pulses selectively via the electrodes. Use of optical means includes the provision of pulses of light selectively to the active region.

Writing and erasing by electrical means is achieved by applying positive or negative voltage pulses. This switches the device between high and low resistive states. The devices may optionally be digital in nature so that a high resistance state can be considered to be "OFF" i.e. representing a "0" and a low resistance state can be considered to be "ON" i.e. representing a "1". The act of switching the device from the OFF state to the ON state may be referred to as a "SET". Switching the device from the ON state to the OFF state is called a "RESET". Depending upon the application of the device the device may work in either digital or analogue circuits. For memory applications the devices can be used in a digital manner whereby a high and low resistance represents a memory state. That is to say an electrical property such as resistance is SET and this indicates an information state associated with the storage device. For other uses however, storage can be operated in an analogue manner in which a resistance value of the device ranges across a broad spectrum of possible values. A plurality of values can thus be stored as information states each associated with a respective electrical property state or value. Such analogue use can be useful in neuromorphic circuits whereby an individual device may be used to represent a weight in a neural network device.

In the case of optical writing and erasing two different types of optical pulses can be utilised. A high intensity pulse of short duration can be used to perform a RESET operation (or write) whilst a small intensity pulse of longer duration can be used to perform a SET operation (or erase). The high intensity pulses convert the phase change material from a crystalline form having a high conductivity to an amorphous form having an associated lower conductivity. The low intensity pulse does the reverse and converts the material from an amorphous state to the crystalline state.

Aptly according certain embodiments of the present invention, the storage device described behaves like a resistor and may be used like one in electrical circuits. The storage device may optionally also be used as a memory element and can be integrated to store data. FIG. 17 illustrates how multiple storage devices 1700 can be integrated into a large array 1705 to store data. FIG. 17 illustrates a circuit schematic of a subset of a resistive memory array utilising a cross bar architecture. Information can be stored as 1's and 0's in the array. A single row $1710_{1-3}$ represents a word line whilst the columns $1720_{1-4}$ represents bit lines. The devices described behave as optical memristors and thus each memory element can be independently switched by optical means. If the resistance of the OFF state is sufficiently high the device can act as a current switch. For example, negligible current will flow in the OFF state whilst in the ON state current flow is allowed.

Optionally the devices can be used in hybrid optoelectronic circuits such as those used in optical or photonic computing or telecommunication applications. In such uses the devices can be integrated with optical components such as on-chip waveguides.

FIG. 18 helps illustrate a possible on-chip method of directing light around a processor to facilitate optical switching of an individual (or multiple) storage device/s. Uses of such an optical wave guide can be used in the application of optical or photonic computing with dual opto-electronic control of the memristor devices. In such uses it is desirable to have a channeling capability for light so that electromagnetic radiation can be steered directly and thereby provided on a processor. This can be achieved by using one or more wave guides 1800. The arrows in FIG. 18 illustrate a path for communication of electromagnetic radiation such as optical light 1810 to and from an active area of a storage device. The planar nature of the wave guide architecture shown (in other words the wave guide is orthogonal to the device) allows the optical exposure of single or multiple memristor devices. Other pathways could of course be utilised.

An alternative method of optically addressing individual, or indeed multiple, storage devices such as the memristor devices as described can also be achieved using pixelated and electrically addressable liquid crystal displays (LCD's). This is illustrated in more detail in FIG. 19.

FIG. 19 helps illustrate an alternative method of optically addressing individual (or multiple) storage devices using a pixelated and electrically addressable LCD display 1900 mounted underneath the optical storage devices. Four storage devices are illustrated in FIG. 19. By way of example and for clarity these are shown provided at the interface between a single electrode 120 and four upper electrodes $110_{1-4}$. It will be appreciated that a larger array made from the storage devices formed between many bottom electrodes and many corresponding upper electrodes could of course be utilised. The LCD display 1900 includes many pixels 1910. Some of the pixels at any time can be turned OFF and as such are off pixels 1920. Six such pixels are illustrated in FIG. 19. By contrast some of the pixels 1910 can be turned ON (and thus are on pixels 1930) and these allow incident electromagnetic radiation in the form of optical light incident at the bottom of the display 1900 to pass through the pixel regions and thus illuminate the active regions of respective storage devices. The LCD is thus mounted directly underneath the optical memristor memory array. Switching of an individual LCD to ON or OFF exposes the corresponding memristor device to a light source. The light source can be a back light or a pixelated light source. Optionally the back light and LCD can be replaced by individual emissive elements in the form of pixelated LEDs, QLED or OLEDs or VCSEL (vertical cavity surface emitting laser) that can be switched on and off individually. Certain embodiments of the present invention thus provide a storage device or multiple storage devices which can be optical switching enabled by the use of embedded particles or quantum dots or complexes or the like whose conductivity or other such electrical property can be modified optically. Use of a percolation threshold and intermixing of two types or more or embedded particles can be used to help optimise a resistance OFF/ON ratio. Use of a phase change material such as a chalcogenide or the like can help optimise a speed of the optical switching.

Writing information or a "SET" operation includes the steps of applying a voltage pulse with positive bias ranging from around 1-3 V with a duration of typically 10 ns. Erasing information or a RESET operation can include the application of a similar pulse with a negative bias. A precise value is dependent on film thickness, device architecture and material properties.

Optical writing and erasing can include the steps of exposing the device to light of a wavelength that may be specific to the type of phase change material. A wavelength of light used may also be dependent on diffraction limits. Optical light used may or may not be polarised. The wavelength of light can be in the visible spectrum ranging from 400 nm to 830 nm. For example, $Ge_2Sb_2Te_5$ can be used where a wavelength of 780 nm is used. These are conventionally used for CDs. For conventional DVDs a 650 nm wavelength can be used. Conventional Blue Ray discs using $Ge_5Sb_2Te_{11}$ materials utilise a 405 nm wavelength and such materials can optionally be utilised as the material for the changeable particles described hereinabove. A pulse duration can be selected dependent upon an amount of material that is desired to undergo a phase transformation. This is because energy should be delivered to each particle and converted to heat for a transformation to take place. Ultrafast conversion of GST from amorphous to crystalline states can be used with pulse durations as fast as nanosecond or indeed femtosecond durations. Laser fluence of around 36 mj/cm 2 and around 13 mj/cm 2 can be used with nanosecond or femtosecond durations respectively. A wavelength of source of 248 nm and pulse times of 20 nanoseconds and 500 fs respectively produce crystalline grains of diameter 50 nm. It will be appreciated by those skilled in the art that any suitable electromagnetic radiation source in the 10-830 nm range could be utilised according to certain embodiments of the present invention. Aptly visible and/or Ultra Violet (UV) and/or Extreme Ultra Violet (EUV) wavelengths can be utilised. Aptly a wavelength range of 10-450 nm is utilised. Shorter wavelengths permit greater resolution in addressing individual memory cells. Shorter wavelength addressing allows chips to be made with a higher density of components.

Optical writing "SET" can be achieved by applying an optical pulse of long duration and low intensity to heat the phase change material above its crystallisation temperature. This crystallises the structure of the PCM material. Typical pulse durations are in the range of 1-100 nanoseconds.

Optical erasure or RESET involves the application of a pulse of short duration but with higher intensity. This converts the PCM material from a crystalline state to amorphous state. Amorphisation is a faster process than crystallisation and can thus take place as fast as 500 ps.

Certain embodiments of the present invention are applicable to the provision and use of an artificial neural network (ANN). An ANN 2000 is illustrated in FIG. 20. In such a system a connection strength between an input and an output is dependent upon a connection strength contained within a so-called hidden layer. FIG. 20 illustrates three respective inputs $2010_{1-3}$ and two respective outputs $2020_{1,2}$. These are interconnected via a hidden layer 2030 which in the embodiment illustrated in FIG. 20 is formed from five optically switchable storage devices provided as memristors. Other numbers of inputs, outputs and hidden layer storage devices can of course be utilised. The connection strength (equivalent to conductance) between a single input and a single output depends upon a weighted sum average of all of the possible paths via which those nodes are connected. For example, the first input $2010_1$ in FIG. 20 is connected to the second output $2020_2$ via five first connection pathways 2040 each connecting the first input to each of the five storage devices and five further connection pathways connecting each respective storage device to the output. Each output 2020 is thus connected to each optically switchable storage device via a respective pathway 2050. Each of the storage devices is optically switchable via the provision of optical light or other such electromagnetic radiation. Certain embodiments of the present invention used as an artificial neural network have the advantage that they can learn and do not need to be initially programmed. Rather they learn by performing training tasks that modify a connection strength in each connection pathway depending upon whether a task was completed successfully or not. ANNs can be utilised in many applications including image and voice recognition, machine learning, medical diagnosis, recognising patterns in financial markets or the like. An advantage of using an artificial neural network utilising optically switchable storage devices of the type above-referenced described is that one can reconfigure, erase or train the neural network using optical means.

FIG. 20 thus helps illustrate a schematic view of a light tuneable neural network in which the connection strength between the "input" and "output" is dependent upon the weighted sum of the conductance states of the memristor devices. The use of optical memristor devices provides a method to train and adjust the weight of the individual memristors on the neural network. It is to be noted that the arrows illustrating the pathways 2040, 2050 represent electronic connections. The connection strength is equivalent to conductance between a single input and a single output and this depends upon the weighted sum average of all of the memristors with which they are connected.

FIG. 21 helps illustrate synaptic efficacy curves showing how a connection strength (or conductance) of a synapse changes depending on the time interval between neuron 1 and neuron 2 firing. The neurons are represented by the inputs and outputs shown in FIG. 20. The synapses are associated with the middle layer and thus by the memristor/s.

Whilst certain embodiments of the invention have been described hereinabove with respect to a storage device in which spaced apart electrodes are in contact with an active region which includes two types of embedded element it will be appreciated that certain embodiments of the present invention are applicable to devices in which the region of insulating material includes one, two, three or many types of embedded particles. The particles can be chosen for their ability to have an electrical property changed reversibly via the application of electromagnetic radiation and/or are selected according to their charge storage capability. For example, FIG. 22 illustrates an alternative embodiment of the present invention. This embodiment is in many respects similar to that illustrated with respect to FIG. 3 in that a lower electrode 120 is spaced apart from an upper electrode 110 and optional charge blocking layers 350, 360 are located at respective interfaces between an electrode and a region of insulating material 310. However, only one type of embedded particle is provided and illustrated in the insulating material 310 in FIG. 22. The embedded particles 2200 have both an optically changeable nature and a charge storage capability. For example, particles of GST alone can be embedded in an insulating matrix 310. The GST particles can be embedded according to techniques above described and are example of changeable particles that are provided in the first material 310 and that have charge storage capacity as well as at least one electrical property that is reversibly changeable responsive to absorption of incident electromagnetic radiation.

Certain embodiments of the present invention thus provide a ultrafast, optical switching resistive memory device. The devices have a different switching mechanism to conventional optical memristor devices and certain embodiments of the present invention relate to devices and manufacturing processes that are far better suited for commercialisation since their fabrication is compatible with industry standard semiconductor and integrated chip manufacturing techniques (broadly classed as being CMOS compatible). Certain embodiments of the present invention relate to devices having an architecture based upon a thin-film located between two metal conducting electrodes. In line with one option an electrically insulating matrix material contains small embedded micron or nanometre sized conducting or semiconducting elements that have charge-storage capabilities. Switching properties arise from the injection and removal of charge from the embedded particles. Charge-storage elements made from materials whose electrical properties are optically tuneable can be used. Materials of this type include fast optical switching phase change materials such as chalcogenide materials. Such materials undergo very large (orders of magnitude) change in their electrical conductivity under optical illumination. Such materials are conventionally known and are, for example, used as optical switching elements in re-writable DVD Blue-Ray technology. They have been demonstrated to have switching speeds as fast as nanosecond and femtosecond speeds.

Certain embodiments of the present invention also include other materials that can undergo conductivity changes under absorption of electromagnetic radiation such as optical illumination. Such alternative materials include photoredox molecules and molecules/polymers that can have their doping level modified by optical means. Certain complexes may alternatively be utilised.

Certain embodiments of the present invention provide storage devices which are optically controllable memristors in which light can modify a conductivity property or other such electrical property of embedded particles. This in turn modifies a charge storage capacity of the device and therefore resistive switching memory properties of the device. As an alternative, resistive switching memory properties of a device can be modified when light modifies the energetic level states within a forbidden band within the device. This alters the charge injection properties of the device.

Throughout the description and claims of this specification, the words "comprise" and "contain" and variations of them mean "including but not limited to" and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of the features and/or steps are mutually exclusive. The invention is not restricted to any details of any foregoing embodiments. The invention extends to any novel one, or novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of manufacturing a storage device for storing information, comprising the steps of:
    providing at least one first electrode and at least one further electrode; and
    providing each of at least one region of a first material between, and in electrical connection with, a respective first electrode and a further electrode; whereby
    said step of providing at least one region comprises providing in the first material, a plurality of changeable particles that have charge storage capacity and at least one electrical property that is reversibly changeable responsive to absorption of incident electromagnetic radiation.

2. The method as claimed in claim 1, wherein one or more of the following is true:
    the changeable particles are particles of phase change material; and
    the changeable particles have a diameter of approximately 5 to 100 nanometers.

3. The method as claimed in claim 1, further comprising:
    the electrical property is switchable responsive to incident electromagnetic radiation in less than seconds between a first electrical property state and at least one further electrical property state and optionally less than 300 ns.

4. The method as claimed in claim 1, further comprising:
    the electrical property is also reversibly changeable responsive to selective application of an electrical signal applied via the first and further electrode.

5. The method as claimed in claim 1, wherein said step of providing at least one region further comprises embedding a plurality of charge storage particles that have charge storage capability in an insulating material that comprises said first material and embedding the plurality of changeable particles in the insulating material.

6. The method as claimed in claim 1, wherein said step of providing at least one region further comprises embedding the plurality of changeable particles in an insulating material as a plurality of particles that have both charge storage capability and at least one electrical property that is reversibly changeable responsive to absorption of incident electromagnetic radiation.

7. The method as claimed in claim 1, further comprising:
    providing a charge blocking barrier between said region and said first electrode and/or between said region and said further electrode.

8. The method as claimed in claim 5, wherein:
    said step of providing a region of a first material further comprises depositing a thin film of an inorganic insulating material; and
    said step of embedding a plurality of charge storage particles further comprises embedding metallic particles and desired particles of a phase change material in the inorganic insulating material.

9. Apparatus for storing information, comprising:
    at least one first electrode and at least one further electrode;
    at least one region of a first material, each region being disposed between, and in electrical connection with, a respective first electrode and a further electrode; and
    a plurality of changeable particles, in the first material, that have charge storage capability and at least one electrical property that is reversibly changeable responsive to absorption of incident electromagnetic radiation.

10. The apparatus as claimed in claim 9, further comprising:
    the electromagnetic radiation is in the wavelength range 10-830 nm.

11. The apparatus as claimed in claim 9, further comprising:
    the electrical property is switchable responsive to incident electromagnetic radiation in less than seconds between a first electrical property state and at least one further electrical property state and optionally less than 300 ns.

12. The apparatus as claimed in claim 9, further comprising:
    a plurality of charge storage particles that have charge storage capability embedded in an insulating material that comprises said first material; and
    the plurality of changeable particles are embedded in the insulating material.

13. The apparatus as claimed in claim 9, further comprising:
    the changeable particles are embedded in an insulating material and are particles that have both charge storage capability and at least one electrical property that is reversibly changeable responsive to absorption of incident light.

14. The apparatus as claimed in claim 12, further comprising:
    the changeable particles are particles of a material that exhibits at least one order of magnitude change in electrical conductivity when illuminated with optical light.

15. The apparatus as claimed in claim 12, wherein one or more of the following is true:
    the changeable particles are particles of phase change material; and the changeable particles have a diameter of approximately 5 to 100 nanometers.

16. The apparatus as claimed in claim 12, further comprising:
the changeable particles are particles of a material that exhibit photo doping or comprise photo redox molecules.

17. An optical memristor device for reversible latched switching, wherein at least a portion of the device has an electrical property that is indicative of a memristor state and is reversibly switchable responsive to incident electromagnetic radiation in less than 60 seconds between a first property state and at least one further property state and optionally is switchable in less than 300 ns.

18. The memristor device as claimed in claim 17, wherein the electrical property is switchable between states in less than 10 ns and optionally less than 1 ns.

19. The memristor device as claimed in claim 17, wherein the memristor device is switchable in response to electromagnetic radiation in a wavelength range of between nm.

20. A memory cell, comprising:
a bit line;
a word line;
a bit line electrode;
a word line electrode; and
an active region between and in electrical connection with the bit line electrode and the word line electrode, wherein an electrical property in the active region that is indicative of a memory cell state is reversibly switchable responsive to incident electromagnetic radiation in less than 60 seconds between a first electrical property state and at least one further electrical property state.

* * * * *